United States Patent
Yoshizaki et al.

(10) Patent No.: US 10,858,615 B2
(45) Date of Patent: Dec. 8, 2020

(54) SURFACE TREATMENT COMPOSITION, PREPARATION METHOD THEREOF, SURFACE TREATMENT METHOD USING THE SAME

(71) Applicant: FUJIMI INCORPORATED, Kiyosu (JP)

(72) Inventors: Yukinobu Yoshizaki, Kiyosu (JP); Koichi Sakabe, Kiyosu (JP); Satoru Yarita, Kiyosu (JP); Kenichi Komoto, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 151 days.

(21) Appl. No.: 16/132,863

(22) Filed: Sep. 17, 2018

(65) Prior Publication Data

US 2019/0093051 A1    Mar. 28, 2019

(30) Foreign Application Priority Data

Sep. 26, 2017 (JP) ................ 2017-185299

(51) Int. Cl.
| | | |
|---|---|---|
| C11D 7/50 | (2006.01) | |
| C11D 3/37 | (2006.01) | |
| C11D 11/00 | (2006.01) | |
| C11D 3/20 | (2006.01) | |
| C11D 7/26 | (2006.01) | |
| H01L 21/3105 | (2006.01) | |
| H01L 21/02 | (2006.01) | |

(52) U.S. Cl.
CPC ............ *C11D 3/378* (2013.01); *C11D 3/2065* (2013.01); *C11D 3/2068* (2013.01); *C11D 3/3707* (2013.01); *C11D 3/3757* (2013.01); *C11D 3/3765* (2013.01); *C11D 7/261* (2013.01); *C11D 7/263* (2013.01); *C11D 7/265* (2013.01); *C11D 7/266* (2013.01); *C11D 11/0047* (2013.01); *H01L 21/02065* (2013.01); *H01L 21/31053* (2013.01)

(58) Field of Classification Search
CPC ................................................. C11D 11/0047
USPC .................................................. 510/175, 176
See application file for complete search history.

(56) References Cited

U.S. PATENT DOCUMENTS

| | | | |
|---|---|---|---|
| 6,440,856 B1 | 8/2002 | Bessho et al. | |
| 2007/0181534 A1* | 8/2007 | Kamimura | B24B 37/044 216/88 |
| 2019/0203027 A1* | 7/2019 | Chen | C08G 61/04 |
| 2019/0300821 A1* | 10/2019 | Yoshizaki | C11D 1/342 |

FOREIGN PATENT DOCUMENTS

JP    2001-064689 A    3/2001

* cited by examiner

*Primary Examiner* — Gregory E Webb
(74) *Attorney, Agent, or Firm* — Foley & Lardner LLP

(57) ABSTRACT

A surface treatment composition according to the present invention is used for treating a surface of a polished object to be polished which is obtained after polishing with a polishing composition including ceria, using the surface treatment composition including a (co)polymer having a monomer-derived structural unit having a carboxyl group or a salt group thereof, a residue removing accelerator composed of a specific compound having a hydroxyl group, and a dispersing medium, wherein pH is less than 7.

20 Claims, No Drawings

SURFACE TREATMENT COMPOSITION, PREPARATION METHOD THEREOF, SURFACE TREATMENT METHOD USING THE SAME

CROSS-REFERENCE TO RELATED APPLICATION

The present application is based on the Japanese patent application No. 2017-185299 filed on Sep. 26, 2017, and a disclosed content thereof is incorporated herein as a whole by reference.

BACKGROUND

1. Technical Field

The present invention relates to a surface treatment composition, a preparation method thereof, and a surface treatment method using the same.

2. Description of Related Arts

In recent years, according to a multilayer wiring on a surface of a semiconductor substrate, a so-called chemical mechanical polishing (CMP) technique of physically polishing and flattening a semiconductor substrate at the time of manufacturing a device has been used. The CMP is a method of planarizing a surface of an object to be polished such as a semiconductor substrate, or the like, by using a polishing composition (slurry) including an abrasive grain such as silica, alumina, ceria, or the like, an anticorrosive agent, a surfactant, or the like. The object to be polished is a wiring made of silicon, polysilicon, silicon oxide, silicon nitride, metal, or the like, a plug, or the like.

A large amount of defects (impurities, foreign substances, residues) remain on a surface of the semiconductor substrate after the CMP step. The defects include an abrasive grain derived from a polishing composition used in CMP, a metal, an organic substance such as an anticorrosive agent, a surfactant, or the like, a silicon-containing material which is an object to be polished, a silicon-containing material or metal occurring by polishing a metal wiring, a plug, or the like, and an organic substance such as a pad debris occurring from various pads, or the like.

If the surface of the semiconductor substrate is contaminated by these defects, electrical characteristics of the semiconductor are adversely affected and thus, there is a possibility that reliability of the device is deteriorated. Therefore, it is desirable to introduce a cleaning step after the CMP step to remove these defects from the surface of the semiconductor substrate.

As a technique for removing these defects, JP 2001-64689 A (corresponding to U.S. Pat. No. 6,440,856) discloses a semiconductor component cleaning solution containing a water-soluble (co)polymer (salt) in which a sulfonic acid (salt) group and/or a carboxylic acid (salt) group is an essential component. JP 2001-64689 A also discloses that by cleaning a semiconductor substrate using the semiconductor component cleaning solution, it is possible to reduce defects such as abrasive grains such as silica, alumina, etc., remaining on the semiconductor substrate after CMP, metal impurities or impurities caused by metal wiring, and the like, while reducing load on an environment.

SUMMARY

However, when the polishing composition used for polishing the object to be polished includes ceria ($CeO_2$) as abrasive grains, it is difficult to remove particle residue derived from ceria by the cleaning solution according to JP 2001-64689 A (corresponding to U.S. Pat. No. 6,440,856). Therefore, surface treatment with a mixture of sulfuric acid and hydrogen peroxide water is further required for removal of particle residue derived from ceria.

Further, the cleaning solution according to JP2001-64689 A (corresponding to U.S. Pat. No. 6,440,856) has a problem in that organic residue on a polished object to be polished cannot be sufficiently removed.

Accordingly, an object of the present invention is to provide a means capable of not only satisfactorily reducing ceria residue but also sufficiently reducing defects other than the ceria residue such as organic residue, and the like, at the time of surface treatment on the polished object to be polished which is obtained after polishing with a polishing composition including ceria.

In order to solve the above problems, the present inventors have keenly studied. As a result, the present inventors found that the above problems may be solved by using a (co)polymer having a monomer-derived structural unit having a carboxyl group or a salt group thereof in combination with a residue removing accelerator made of a compound having a specific structure, and completed the present invention.

That is, an embodiment for solving the above problems of the present invention relates to a surface treatment composition for surface-treating a polished object to be polished which is obtained after polishing with a polishing composition including ceria, the surface treatment composition including:

a (co)polymer having a monomer-derived structural unit having a carboxyl group or a salt group thereof;

at least one residue removing accelerator selected from the group consisting of a polyvalent hydroxy compound, a derivative of a polyvalent hydroxy compound having one hydroxyl group, and a derivative of a hydroxycarboxylic acid having one or more hydroxyl groups and having no carboxyl group; and a dispersing medium, wherein pH is less than 7.

DETAILED DESCRIPTION

Hereinafter, the present invention will be described. In addition, the present invention is not limited to exemplary embodiments below. In the present specification, "X to Y" indicating a range means "X or more and Y or less". In addition, unless specifically stated otherwise used herein, operations and measurement of physical properties, and the like, are performed under conditions of room temperature (20° C.~25° C.)/relative humidity of 40~50% RH.

In the present specification, (co)polymer is a generic term including copolymer and homopolymer.

In the present specification, (meth)acryl is a generic term including acryl and methacryl, and (meth)acrylate is a generic term including acrylate and methacrylate.

<Defects>

A surface treatment composition according to the present invention is used for reducing defects remaining on a surface of a polished object to be polished (hereinafter also referred to as "object to be surface treated").

The surface treatment composition according to the present invention has a high removal effect regardless of the type of the defect, but in particular, has an extremely high removal effect on ceria residue (particle residue derived from ceria, for example) and organic residue. Therefore, the surface treatment composition according to the present invention is preferably used for reducing the ceria residue and the organic residue on the surface of the polished object to be polished, and is more preferably used for reducing the ceria residue. Here, the ceria residue on the surface of the polished object to be polished which is obtained after polishing with a polishing composition including ceria usually exists as particle residues. Therefore, the surface treatment composition according to the present invention is preferably used for reducing the particle residue on the surface of the polished object to be polished.

Among the defects, the particle residue, the organic residue, and other residues are greatly different in color and shape. Here, the organic residue refers to a component made of an organic compound such as an organic low molecular compound or a polymer compound, or a salt thereof, or the like, among the defects attached to a surface of the object to be surface treated. The particle residue refers to a component derived from a granular inorganic substance such as abrasive grain (for example, an abrasive grain containing ceria) included in the polishing composition, or the like, among the defects attached to the surface of the object to be surface treated. Other residues include a residue made of components other than the particle residue and the organic residue, a mixture of the particle residue and the organic residue, and the like. From this, judgment of the type of defect can be performed visually from an image of SEM observation. Further, element analysis by an energy dispersive X-ray analyzer (EDX) may be used for the judgment as necessary.

<Surface Treatment Composition>

An embodiment of the present invention is a surface treatment composition for surface treating a polished object to be polished which is obtained after polishing with a polishing composition including ceria, the surface treatment composition including a (co)polymer having a monomer-derived structural unit having a carboxyl group or a salt group thereof (also referred to as "carboxy structural unit-containing (co) polymer" in the present specification), at least one residue removing accelerator (also referred to simply as "residue removing accelerator" in the present specification) selected from the group consisting of a polyvalent hydroxy compound, a derivative of a polyvalent hydroxy compound having one hydroxyl group, and a derivative of a hydroxycarboxylic acid having one or more hydroxyl groups and having no carboxyl group, and a dispersing medium, wherein pH is less than 7. According to an embodiment of the present invention, there may be provided a means capable of not only satisfactorily reducing ceria residue but also sufficiently reducing defects other than the ceria residue such as organic residue, and the like, at the time of surface treatment on the polished object to be polished which is obtained after polishing with a polishing composition including ceria.

By the constitution, the present inventors have predicted a mechanism capable of reducing defects, in particular, both particle residue and organic residue, in a polished object to be polished which is obtained after polishing with a polishing composition including ceria as follows.

On the polished object to be polished or in the surface treatment composition, there are impurities such as particle residue (particularly, particle residue derived from ceria) included in the polishing composition, organic compounds (organic residue) included in the polishing composition, derived from pad debris or the like, and the like.

The residue removing accelerator is coordinated to a surface of a ceria residue and a polished object to be polished by an interaction between a functional group such as a hydroxyl group, an ether group, an ester group, or the like, in a molecule; and the residue removing accelerator thereby penetrates between the ceria residue present on the polished object to be polished and the polished object to be polished. Here, the residue removing accelerator is coordinated to the surface of the ceria residue by directing the functional group thereof toward a ceria residue side and an opposite side (a side of a surface treatment composition). As a result, a space between the ceria residue and the polished object to be polished becomes wider, and the carboxy structural unit-containing (co) polymer becomes easier to penetrate therebetween. In addition, the carboxy structural unit-containing (co) polymer penetrating therebetween is coordinated to the surface of the residue removing accelerator that is coordinated to the surface of the ceria residue in a form that the carboxyl group is directed toward the ceria residue side and the opposite side (the side of the surface treatment composition). As a result, due to the coordination of the carboxy structural unit-containing (co) polymer, dispersibility of the ceria residue is improved and the ceria residue is more easily removed.

Further, when the organic residue or other residues are hydrophilic, the carboxy structural unit-containing (co) polymer is coordinated by directing the carboxyl group toward the ceria residue side and the opposite side (the side of the surface treatment composition). In addition, when the organic residue or other residues are hydrophobic, the carboxy structural unit-containing (co) polymer is coordinated by directing a hydrophobic portion toward these residues and directing the carboxyl group toward the opposite side (the side of the surface treatment composition). In addition, similar to the polished object to be polished, when these are hydrophilic, it is coordinated by directing the carboxyl group toward a side of the polished object to be polished and an opposite side thereof (the side of surface treatment composition), and when these are hydrophobic, it is coordinated by directing the hydrophobic portion toward a side of the polished object to be polished and directing the carboxyl group toward the opposite side (the side of the surface treatment composition). As a result, the dispersibility of the organic residue or other residues is improved, and potential repulsion occurs between these residues and the polished object to be polished. In addition, the organic residue or other residues are more easily removed, and reattachment of these residues to the polished object to be polished is suppressed.

Here, when the pH of the surface treatment composition is less than 7, the dispersibility of the ceria residue in the surface treatment composition is sufficiently improved, and thus the ceria residue becomes easily separated from the polished object to be polished. Therefore, within the pH range, a remarkably removing effect of the ceria residue by the residue removing accelerator and the carboxy structural unit-containing (co) polymer is obtained.

In addition, the above mechanism is based on the prediction, and the present invention is not limited to the above mechanism at all. Hereinafter, the constitution of the surface treatment composition according to an embodiment of the present invention will be described in detail.

((Co)polymer Having Monomer-Derived Structural Unit Having Carboxyl Group or Salt Group Thereof)

The surface treatment composition according to an embodiment of the present invention includes a (co)polymer having a monomer-derived structural unit having a carboxyl group or a salt group thereof (carboxy structural unit-containing (co) polymer). The carboxy structural unit-containing (co) polymer functions to facilitate removal of the organic compound included in the polishing composition, the organic residue derived from the pad debris, and the like.

The monomer having a carboxyl group or a salt group thereof is not particularly limited, but is preferably a carboxyl group-containing vinyl monomer having a carboxyl group and having a polymerizable double bond.

The carboxyl group-containing vinyl monomer is not particularly limited, but for example, includes (meth)acrylic acid, α-haloacrylic acid, maleic acid, maleic anhydride, maleic acid monoalkyl ester, itaconic acid, vinyl acetate, allyl acetate, cinnamic acid, fumaric acid, fumaric acid monoalkyl ester, crotonic acid, itaconic acid, itaconic acid monoalkyl ester, itaconic acid glycol monoether, citraconic acid, citraconic acid monoalkyl ester, etc. These monomers may be used alone or in combination of two or more thereof. Among them, (meth)acrylic acid is preferable, and acrylic acid is more preferable. That is, the carboxy structural unit-containing (co) polymer is preferably a (co)polymer having a structural unit derived from (meth) acrylic acid or a salt thereof, and is more preferably a (co)polymer having a structural unit derived from acrylic acid or a salt thereof.

A main chain of a copolymer having the monomer-derived structural unit having a carboxyl group or a salt group thereof and a structural unit derived from other monomers may be composed of only carbon atoms, or may contain an oxygen atom, a nitrogen atom or a phosphorus atom in addition to the carbon atom.

The structural unit derived from other monomers in the copolymer having the monomer-derived structural unit having a carboxyl group or a salt group thereof and the structural unit derived from other monomers is not particularly limited, and known structural units can be used. As other monomers constituting the structural unit derived from other monomers, for example, an ethylenically unsaturated monomer other than a carboxyl group-containing vinyl monomer, diamine, diepoxide, hypophosphorous acid, a salt thereof, or the like, may be included.

The ethylenically unsaturated monomer is not particularly limited, but for example, includes styrene monomers such as styrene, o-methylstyrene, m-methylstyrene, p-methylstyrene, α-methylstyrene, p-phenylstyrene, p-ethylstyrene, 2,4-dimethylstyrene, p-tert-butylstyrene, p-n-hexylstyrene, p-n-octylstyrene, p-n-nonylstyrene, p-n-decylstyrene, p-n-dodecylstyrene and styrenesulfonic acid, and the like; (meth) acrylic acid ester monomers such as methyl(meth) acrylate, ethyl(meth)acrylate, n-propyl(meth)acrylate, isopropyl(meth)acrylate, n-butyl(meth)acrylate, isobutyl(meth) acrylate, tert-butyl(meth)acrylate, n-octyl(meth)acrylate, 2-ethylhexyl(meth)acrylate, stearyl(meth)acrylate, lauryl (meth)acrylate, phenyl(meth)acrylate, diethylaminoethyl (meth)acrylate, dimethylaminoethyl(meth)acrylate, and the like; olefin monomers such as ethylene, propylene, isobutylene, and the like; vinyl ester monomers such as vinyl propionate, vinyl acetate, vinyl benzoate, and the like; vinyl ether monomers such as vinyl methyl ether, vinyl ethyl ether, and the like; vinyl ketone monomers such as vinyl methyl ketone, vinyl ethyl ketone, vinyl hexyl ketone, and the like; N-vinyl monomers such as N-vinylcarbazole, N-vinylindole, N-vinylformamide, N-vinylpyrrolidone, and the like; heterocyclic vinyl monomers such as vinyl naphthalene, vinyl pyridine, and the like; (meth)acrylic monomers such as acrylonitrile, methacrylonitrile, acrylamide, 2-acrylamide-2-methylpropanesulfonic acid, and the like. One of these may be used alone, or two or more of them may be used in combination.

As other monomers, among them, an ethylenically unsaturated monomer or a salt thereof is preferable, and a styrene monomer or a (meth)acrylic acid derivative is more preferable, and a styrene sulfonic acid or 2-acrylamide-2-methylpropanesulfonic acid is even more preferable.

As the (co)polymer having a monomer-derived structural unit having a carboxyl group or a salt group thereof, a poly(meth)acrylic acid or a salt thereof, a copolymer of (meth)acrylic acid and styrene sulfonic acid or a salt thereof, or a copolymer composed of a reaction product of hypophosphorous acid or a salt thereof, (meth)acrylic acid and 2-(meth)acrylamide-2-methylpropanesulfonic acid, or a salt thereof is preferable.

In addition, as the (co)polymer having a monomer-derived structural unit having a carboxyl group or a salt group thereof, a polyacrylic acid or a salt thereof, a copolymer of methacrylic acid and styrene sulfonic acid or a salt thereof, or a copolymer composed of a reaction product of hypophosphorous acid or a salt thereof, acrylic acid and 2-acrylamide-2-methylpropanesulfonic acid or a salt thereof is more preferable.

The (co)polymer having a monomer-derived structural unit having a carboxyl group or a salt group thereof, polyacrylic acid or a salt thereof is further more preferable.

In the carboxy structural unit-containing (co) polymer, the lower limit value of a content ratio of the monomer-derived structural unit having a carboxyl group or a salt group thereof with respect to the total number of moles of the monomer-derived structural unit having a carboxyl group or a salt group thereof and other structural units, is preferably 1 mol % or more, more preferably 10 mol % or more, further preferably 50 mol % or more, and particularly preferably 80 mol % or more. In addition, the upper limit value of the content ratio of the monomer-derived structural unit having a carboxyl group or a salt group thereof with respect to the sum of the monomer-derived structural unit having a carboxyl group or a salt group thereof and other structural units, is preferably 100 mol % or less. Within this range, it is possible to satisfactorily exhibit an action effect of the carboxy structural unit-containing (co) polymer. Among them, a homopolymer having a monomer-derived structural unit having a carboxyl group or a salt group thereof is most preferable.

The monomer-derived structural unit having a carboxyl group or a salt group thereof may be partly or entirely a salt. Examples of the salt include alkali metal salts such as sodium salt, potassium salt, and the like, salts of Group 2 elements such as calcium salts, magnesium salts, and the like, amine salts, ammonium salts, and the like. Among them, sodium salt is particularly preferable.

The lower limit value of a weight average molecular weight of the carboxy structural unit-containing (co) polymer is preferably 400 or more, more preferably 500 or more, further more preferably 1,000 or more, and particularly preferably 2,000 or more. In addition, the upper limit value of the weight average molecular weight of the carboxy structural unit-containing (co) polymer is preferably 2,000,000 or less, more preferably 1,000,000 or less. Within this range, the action effect of the present invention can be exhibited more satisfactorily. In addition, the weight average molecular weight of the carboxy structural unit-containing (co) polymer can be measured by gel permeation chromatography (GPC). Details of the measuring method are described in Examples.

In addition, as the carboxy structural unit-containing (co) polymer, a commercially available product may be used. Examples of commercially available product include, but are not limited to, Belclene (registered trademark) 500, or Belsperse (registered trademark) 164 manufactured by BWA, and the like, as the copolymer consisting of the reaction product of hypophosphorous acid or a salt thereof and acrylic acid, and Belclene (registered trademark) 400 manufactured by BWA, and the like, as the copolymer composed of the reaction product of hypophosphorous acid or a salt thereof, acrylic acid and 2-acrylamido-2-methyl-propanesulfonic acid, respectively.

The lower limit value of the content of the carboxy structural unit-containing (co) polymer in the surface treatment composition is preferably 0.0001 g/L or more. Within this range, an effect of removing the organic compound included in the polishing composition or the organic compound derived from the pad debris, or the like is further improved. From the same viewpoint, the lower limit value of the content of the carboxy structural unit-containing (co) polymer is more preferably 0.001 g/L or more, further more preferably 0.1 g/L or more, and particularly preferably 1 g/L or more. Further, the upper limit value of the content of the carboxy structural unit-containing (co) polymer in the surface treatment composition is preferably 30 g/L or less. Within this range, it becomes easier to remove the carboxy structural unit-containing (co) polymer after the surface treatment, and it is possible to further inhibit the carboxy structural unit-containing (co) polymer itself after surface treatment from remaining as an organic residue. From the same viewpoint, the upper limit value of the content of the carboxy structural unit-containing (co) polymer is more preferably 10 g/L or less, and further more preferably 5 g/L or less.

(Residue Removing Accelerator)

The surface treatment composition according to an embodiment of the present invention includes at least one residue removing accelerator selected from the group consisting of a polyvalent hydroxy compound, a derivative of a polyvalent hydroxy compound having one hydroxyl group, and a derivative of a hydroxycarboxylic acid having one or more hydroxyl groups and having no carboxyl group. The residue removing accelerator has an action to facilitate removal of the ceria residue.

In the present specification, the polyvalent hydroxy compound is a compound including two or more hydroxyl groups in the molecule, and does not include an acidic group or a salt thereof such as a carboxyl group or a salt group thereof, a sulfo group or a salt group thereof, a phosphate group (—O—P(=O) (OH)$_2$) or a salt thereof, a phosphonic group (—P(=O)(OH)$_2$) or a salt thereof, or the like, and a basic group such as amino group, or the like. Further, it is assumed that the polyvalent hydroxy compound may have an ether group or an ester group in the molecule.

In the present specification, the hydroxycarboxylic acid is a compound including one or more hydroxyl groups and one or more carboxyl groups or a salt group thereof in the molecule, and does not include an acidic group or a salt thereof other than a carboxyl group or a salt group thereof, such as a sulfo group or a salt group thereof, a phosphate group (—O—P(=O) (OH)$_2$) or a salt thereof, a phosphonic group (—P(=O) (OH)$_2$) or a salt thereof, and a basic group such as amino group, or the like. Further, it is assumed that the hydroxycarboxylic acid may have an ether group or an ester group in the molecule.

Further, in the present specification, when the residue removing accelerator has a partial structure represented by SO$_x$ or NO$_y$ (where, x and y are each independently a real number of 1 to 5), this compound is regarded as a compound having a partial structure represented by SO$_x$ or NO$_y$ to be described below.

The polyvalent hydroxy compound is not particularly limited, and known compounds can be used. As the polyvalent hydroxy compound, polyoxyalkylene compounds, sugar alcohols or other polyvalent alcohols other than these, polyvalent phenols, and the like, can be included.

The polyoxyalkylene compound refers to polyoxyalkylene (including polyalkylene glycol) obtained by (co)polymerizing two or more alkylene glycols, or a derivative thereof.

The polyoxyalkylene compound is not particularly limited, but for example, includes polyalkylene glycols such as polyethylene glycol, polypropylene glycol, polybutylene glycol, and an ethylene glycol-propylene glycol block copolymer; ethers of polyalkylene glycol and polyvalent alcohol other than the alkylene glycol such as polyoxyethylene mono- or di-bisphenol A, polyoxypropylene mono- or di-bisphenol A, polyoxyethylene glyceryl ether (for example, the number of partial structures derived from glycerin is 1, the number of partial structures derived from polyoxyethylene is 1, 2 or 3), polyoxypropylene glyceryl ether (for example, the number of partial structures derived from glycerin is 1 and the number of partial structures derived from polyoxypropylene is 1, 2 or 3), and the like.

The sugar alcohol refers to a compound obtained by reducing a carbonyl group of aldose or ketose. The sugar alcohol is not particularly limited, but for example, includes polyhydroxyalkane ($C_nH_{(n+2)}(OH)_n$), polyhydroxy cycloalkane ($(CH(OH))_m$), sugar alcohol produced by reduction of polysaccharide and the like.

In addition, the sugar alcohol in which the D or L form is present may be either D form or L form, or a mixture of D form and L form.

The polyhydroxyalkane is not particularly limited, and known polyhydroxyalkanes can be used. When n is 3 to 10 in the polyhydroxyalkane ($C_nH_{(n+2)}(OH)_n$), it is commonly referred to as tritol, tetritol, pentitol, hexitol, heptitol, octitol, nonitol, and decitol, respectively. In addition, each sugar alcohol has a plurality of stereoisomers depending on the number of asymmetric carbon atoms. Examples of the tritol having 3 carbon atoms may include glycerin. Examples of the tetritol having 4 carbon atoms may include threitol and erythritol. Examples of the pentitol having 5 carbon atoms include arabinitol, ribitol and xylitol. Examples of the hexitol having 6 carbon atoms include sorbitol, iditol, galactinol, mannitol, and the like. Examples of heptitol having 7 carbon atoms include volemitol, perseitol, and the like. Examples of the octitol having 8 carbon atoms include D-erythro-D-galactooctitol, D-erythro-L-galactooctitol, D-erythro-L-talooctitol, erythromannooctitol, D-threo-L-galaoctitol, and the like. Examples of the nonitol having 9 carbon atoms include D-arabo-D-mannononitol, and the like. Examples of the decitol having 10 carbon atoms include D-gluco-D-galladecitol, and the like.

The polyhydroxycycloalkane is not particularly limited, and known polyhydroxycycloalkanes can be used. Examples of the polyhydroxy cycloalkane ($(CH(OH))_m$) include bornesitol, conduritol, inositol, ononitol, pinpollitol, quebraquitol, valienol, viscumitol, pinitol, quercitol, and the like. Here, when explaining the inositol as an example, the inositol has 9 isomers (7 kinds of optical inert materials and a pair of enantiomers) depending on the position of the hydroxyl group. As the inositol, only one type of isomer may be used, or two or more types of isomers may be used in combination. As the inositol isomer, any of myo-inositol, epi-isoinositol, allo-inositol, muco-inositol, neo-inositol, chiro-inositol, scyllo-inositol and cis-inositol can be used.

The sugar alcohol produced by reduction of the polysaccharide is not particularly limited, and known sugar alcohols produced by reduction of the polysaccharide can be used. The sugar alcohol produced by reduction of the disaccharide is not particularly limited, but includes, for example, isomalt, lactitol, maltitol, and the like The sugar alcohol is not particularly limited, but has preferably 3 to 12 carbon atoms, and more preferably a polyhydroxy cycloalkane.

Other polyvalent alcohols are not particularly limited, and known polyvalent alcohols can be used. As other polyvalent alcohol, alkanol, a (poly)ether compound (excluding those included in the polyalkylene glycol-based compound) having a structure formed by condensation of alkylene glycol, and polyvalent alcohols other than alkylene glycol, a (poly) ether compound having a structure formed by condensation of polyvalent alcohol other than the alkylene glycol, and the like, is preferable. Here, the (poly)ether compound includes a compound having a structure having one or more ether groups in the molecule, and the like. Among them, trihydric or higher polyvalent alcohols are preferable, polyvalent alcohols having trivalence or more to hexavalence or less are more preferable, and polyvalent alcohols having trivalence or more to tetravalence or less are still more preferable.

Specific examples of other polyvalent alcohol include, but are not particularly limited to, diols such as ethylene glycol, propylene glycol, 1,4-butanediol, 1,3-butanediol, 1,6-hexanediol, 1,4-dimethylolcyclohexane, neopentyl glycol, dimer diol, adamantanediol; triols such as trimethylolmethane, trimethylolethane, trimethylolpropane, trimethylolbutane, 1,3,5-adamantanetriol; tetraol such as pentaerythritol, di(trimethylolpropane), multiol such as di(pentaerythritol), tri(pentaerythritol), and the like.

Polyvalent phenol refers to a compound having two or more hydroxyl groups directly bonded to a benzene ring or a condensed ring thereof, or a derivative thereof. In the present specification, the polyvalent phenol includes not only a compound having a structure in which two or more hydroxyl groups are directly bonded to one benzene ring or a condensed ring thereof, but also a compound including two or more benzene ring or condensed ring bonded with one hydroxyl group. Among them, trivalent or higher polyvalent phenol is preferable, and polyvalent phenol having trivalence or more to hexavalence or less is more preferable.

Specific examples of the polyvalent phenol include a divalent phenol such as catechol, resorcinol, hydroquinone, a trivalent phenol such as pyrogallol and phloroglucinol, and a hexavalent phenol such as hexahydroxybenzene.

A derivative of a polyvalent hydroxy compound having one hydroxyl group refers to a compound having one remaining hydroxyl group as a derivative of the above polyvalent hydroxy compound.

The polyvalent hydroxy compound constituting the derivative of the polyvalent hydroxy compound having one hydroxyl group is preferably a polyoxyalkylene compound.

The derivative of the polyvalent hydroxy compound having one hydroxy group is not particularly limited, but is preferably an ether derivative (for example, an alkyl ether, an allyl ether, or the like) derived from a polyvalent hydroxy compound and having one hydroxyl group, or an ester derivative (for example, an alkyl ester, an allyl ester, or the like) of a polyvalent hydroxy compound and a monovalent carboxylic acid, having one hydroxyl group. As the ether and ester, alkyl ether and alkyl ester are more preferable, respectively.

The alkyl group or aryl group of the alkyl ether or aryl ether or the alkyl ester or aryl ester is not particularly limited, but has preferably 1 to 32 carbon atoms, more preferably 1 to 20 carbon atoms, and even more preferably 1 to 18 carbon atoms.

Specific examples of the alkyl group include, but are not specifically limited to, a methyl group, an ethyl group, an n-propyl group, an isopropyl group, an n-butyl group, an isobutyl group, an n-pentyl group, an isopentyl group, an n-hexyl group, an isohexyl group, a cyclohexyl group, an n-octyl group, an isooctyl group, a 2-ethylhexyl group, an n-nonyl group, an isononyl group, a tert-nonyl group, a decyl group, an isodecyl group, an undecyl group, a dodecyl group, an isododecyl group, a dodecahexyl group, a dodecaoctyl group, an octyldodecyl group, a stearyl group, a palmityl group (cetyl group), a cetostearyl group, a decyltetradecyl group, a hexyldecyl group, a behenyl group, a lauryl group, a lanolin group, and the like. Further, an arylalkyl group such as a benzyl group, a phenylpropyl group, or the like, may be included.

The monovalent carboxylic acid is not particularly limited, but has preferably 1 to 32 carbon atoms, more preferably 1 to 20 carbon atoms, and still more preferably 1 to 18 carbon atoms.

Specific examples of the monovalent carboxylic acid include, but are not particularly limited to, aliphatic monocarboxylic acids such as formic acid, acetic acid, propionic acid, butyric acid, isobutyric acid, valeric acid, caproic acid, enanthic acid, caprylic acid, pelargonic acid, capric acid, 2-ethyl-hexane carboxylic acid, undecyl acid, lauric acid, isododecylic acid, tridecylic acid, myristic acid, pentadecylic acid, palmitic acid (cetylic acid), heptadecylic acid, stearic acid, nonadecanoic acid, arachidic acid, behenic acid, lignoceric acid, cerotic acid, heptacosanoic acid, montanic acid, melissic acid, lacceric acid, undecylenic acid, oleic acid, sorbic acid, linoleic acid, linolenic acid, arachidonic acid, octenoic acid, and the like; alicyclic monocarboxylic acids such as cyclopentanecarboxylic acid, cyclohexanecarboxylic acid, cyclooctanecarboxylic acid, and the like; aromatic monocarboxylic acids such as benzoic acid, toluic acid, cinnamic acid, benzylic acid, biphenylcarboxylic acid, naphthalenecarboxylic acid, tetralincarboxylic acid, and the like. Among them, aliphatic monocarboxylic acid is preferable, and saturated aliphatic carboxylic acid is more preferable.

Specific examples of the derivative of polyvalent hydroxy compound having one hydroxyl group include, but are not particularly limited to, polyoxyethylene monomethyl ether, polyoxyethylene monoethyl ether, polyoxyethylene monolauryl ether, polyoxyethylene monocetyl ether, polyoxyethylene monooleyl ether, polyoxyethylene monoisododecyl ether, polyoxyethylene mono-2-ethylhexyl ether, polyoxypropylene monomethyl ether, polyoxypropylene monoethyl ether, polyoxypropylene monolauryl ether, polyoxypropylene monocetyl ether, polyoxypropylene monooleyl ether, polyoxypropylene monoisododecyl ether, polyoxypropylene mono-2-ethylhexyl ether, polyoxyethylene monomethyl ester, polyoxyethylene monoethyl ester, polyoxyethylene monolaurate, polyoxyethylene monocetylate, polyoxyethylene monooleate, polyoxyethylene monoisododecylate, polyoxyethylene mono-2-ethyl hexylate, polyoxypropylene monomethyl ester, polyoxypropylene monoethyl ester, polyoxypropylene monolaurate, polyoxypropylene monocetylate, polyoxypropylene monooleate, polyoxypropylene monoisododecylate, polyoxypropylene mono-2-ethyl hexylate, and the like.

A derivative of a hydroxycarboxylic acid having one or more hydroxyl groups and no carboxyl group refers to a compound having no carboxyl group and having one or more remaining hydroxyl groups as a derivative of a hydroxycarboxylic acid. Here, the carboxyl group of the hydroxycarboxylic acid is substituted with other groups.

The hydroxycarboxylic acid constituting the derivative of hydroxycarboxylic acid having one or more hydroxyl groups and no carboxyl group is not particularly limited, and known hydroxycarboxylic acid can be used.

The derivative of hydroxycarboxylic acid having one or more hydroxyl groups and having no carboxyl group is preferably an ester derivative of hydroxycarboxylic acid and a monovalent alcohol such as an ester obtained from hydroxycarboxylic acid and monohydric alcohol while having one or more hydroxyl groups.

The hydroxycarboxylic acid constituting the derivative of the hydroxycarboxylic acid having one or more hydroxyl groups and no carboxyl group is not particularly limited, but is preferably hydroxycarboxylic acid having one hydroxyl group and one carboxyl group.

Specific examples of the hydroxycarboxylic acid include, but are not limited to, aliphatic hydroxycarboxylic acids such as lactic acid, malic acid, citric acid, isocitric acid, tartronic acid, glyceric acid, glycolic acid, 2-hydroxybutyric acid, 3-hydroxybutyric acid (hydroxyisobutyric acid), 4-hydroxyacetic acid, tartaric acid, mevalonic acid, quinic acid, pantoic acid, dimethylolpropionic acid, and the like; and aromatic hydroxycarboxylic acids such as shikimic acid, salicylic acid (orthohydroxybenzoic acid), parahydroxybenzoic acid, metahydroxybenzoic acid, 2-hydroxy-6-naphthoic acid, 2-hydroxy-3-naphthoic acid, 1-hydroxy-4-naphthoic acid, 4-hydroxy-4'-carboxydiphenyl ether, 2,6-dichloro-parahydroxybenzoic acid, 2-chloro-parahydroxybenzoic acid, 2,6-difluoro-parahydroxybenzoic acid, 4-hydroxy-4'-biphenylcarboxylic acid, and the like. Among them, the aliphatic hydroxycarboxylic acid is preferable.

The monovalent alcohol is not particularly limited, but has preferably 1 to 32 carbon atoms, more preferably 1 to 20 carbon atoms, and still more preferably 1 to 18 carbon atoms.

Specific examples of the monohydric alcohol include, but are not limited to, aliphatic alcohols such as methanol, ethanol, propanol, isopropanol, butanol, isobutanol, pentanol, isopentanol, hexanol, isohexanol, cyclohexyl alcohol, octanol, isooctanol, 2-ethylhexyl alcohol, nonyl alcohol, isononyl alcohol, tert-nonyl alcohol, decanol, isodecanol, undecanol, dodecanol, isododecanol, dodecahexanol, dodecaoctanol, allyl alcohol, oleyl alcohol, isostearyl alcohol, octyldodecanol, stearyl alcohol, palmityl alcohol (cetyl alcohol), cetostearyl alcohol, decyl tetradecanol, hexyl decanol, behenyl alcohol, lauryl alcohol, lanolin alcohol, and the like; and aromatic alcohols such as benzyl alcohol, 3-phenyl propanol, and the like. Among them, an aliphatic alcohol is preferable, and a saturated aliphatic alcohol is more preferable.

In addition, when the hydroxycarboxylic acid has two or more hydroxyl groups, if at least one hydroxyl group remains, other hydroxyl groups may be substituted. Here, it is preferable that other hydroxyl groups are an ether, or an ester obtained from a monovalent carboxylic acid. Here, the ether is more preferably an alkyl ether or aryl ether, and more preferably an alkyl ether. Here, as the kind of ether or the kind of alcohol constituting ether, the same materials as those described in the derivative of the polyvalent hydroxy compound having one hydroxyl group can be used. In addition, the monovalent carboxylic acid preferably constitutes an alkyl ester or aryl ester, and more preferably constitutes an alkyl ester. Here, as the kind of ester or the kind of monovalent carboxylic acid constituting the ester, the same materials as those described in the derivative of the polyvalent hydroxy compound having one hydroxyl group can be used.

Specific examples of the derivative of hydroxycarboxylic acid having one or more hydroxyl groups and no carboxyl group include, but are not particularly limited to, methyl glycolate, ethyl glycolate, methyl lactate, ethyl lactate, methyl 2-hydroxybutyrate, ethyl 2-hydroxybutyrate, methyl 3-hydroxybutyrate, ethyl 3-hydroxybutyrate, methyl 4-hydroxybutyrate, ethyl 4-hydroxybutyrate, methyl hydroxyisobutyrate, ethyl hydroxyisobutyrate, methyl glycerate, ethyl glycerate, methyl quinate, ethyl quinate, methyl pantoate, ethyl pantoate, methyl mevalonate, ethyl mevalonate, dimethyl tartrate, diethyl tartrate, dimethyl malate, diethyl malate, dimethyl tartronate, diethyl tartronate, trimethyl citrate, triethyl citrate, methyl dimethylol propionic acid, ethyl dimethylol propionic acid, methyl shikimate, ethyl shikimate, methyl salicylate, ethyl salicylate, and the like.

From the viewpoint of an effect of removing the ceria residue and productivity, focusing on the number of hydroxyl groups, the residue removing accelerator is preferably at least one selected from the group consisting of a polyvalent hydroxy compound having 2 or more to 9 or less hydroxyl groups; a compound having one hydroxyl group as an ether derivative of a polyvalent hydroxy compound having 2 or more to 9 or less hydroxyl groups; a compound having one hydroxyl group as an ester derivative of a polyvalent hydroxy compound having 2 or more to 9 or less hydroxyl groups and a monovalent carboxylic acid; and a compound having 1 or more to 4 or less hydroxyl groups and no carboxyl group as an ester derivative of a hydroxycarboxylic acid and a monohydric alcohol. Further, the residue removing accelerator is more preferably at least one selected from the group consisting of a polyvalent hydroxy compound having 2 or more to 6 or less hydroxyl groups; a compound having one hydroxyl group as an ether derivative of a polyvalent hydroxy compound having 2 or more to 6 or less hydroxyl groups; a compound having 2 or more to 6 or less hydroxyl groups as an ester derivative of a polyvalent hydroxy compound and a monovalent carboxylic acid; and a compound having 1 or more to 2 or less hydroxyl groups and no carboxyl group as an ester derivative of a hydroxycarboxylic acid and a monohydric alcohol.

In addition, among these residue removing accelerators, polyethylene glycol, polypropylene glycol, ethylene glycol-propylene glycol block copolymer, polyoxyethylene mono-bisphenol A, polyoxyethylene glyceryl ether, glycerin, xylitol, sorbitol, trimethylolethane, trimethylolpropane, pentaerythritol, di(trimethylolpropane), polyoxyethylene monomethyl ether, polyoxyethylene monoisododecyl ether, polyoxyethylene monolaurate, dimethyl tartrate, triethyl citrate, methyl hydroxy isobutyrate, ethyl glycolate, methyl glycerate are preferable, polyethylene glycol, polypropylene glycol, ethylene glycol-propylene glycol block copolymer, polyoxyethylene monobisphenol A, polyoxyethylene glyceryl ether, glycerin, xylitol, sorbitol, trimethylol ethane, trimethylol propane, pentaerythritol, di(trimethylolpropane), polyoxyethylene monomethyl ether, polyoxyethylene monoisododecyl ether, polyoxyethylene monolaurate, dimethyl tartrate, and triethyl citrate are more preferable, polyethylene glycol, polypropylene glycol, xylitol, sorbitol, trimethylolethane, trimethylolpropane, di(trimethylolpropane), polyoxyethylene monomethyl ether, dimethyl tartrate, and triethyl citrate are still more preferable, and xylitol, trimethylolpropane, trimethylol ethane, dimethyl tartrate are particularly preferable, and glycerin are most preferable.

The lower limit value of the molecular weight of the residue removing accelerator is not particularly limited, but is preferably 48 or more. Further, the upper limit value of the molecular weight of the residue removing accelerator is not particularly limited, but is preferably 2000 or less.

Within this range, it is easier for the residue removing accelerator to penetrate between the ceria residue and the polished object to be polished. From this, a speed at which the residue removing accelerator penetrates between the ceria residue and the polished object to be polished is sufficiently faster than a speed at which the carboxy structural unit-containing (co) polymer is coordinated to the residue or the polished object to be polished. As a result, the effect of the present invention is more improved. The upper limit value of the molecular weight of the residue removing accelerator is more preferably 1000 or less, further more preferably less than 1000, still more preferably 600 or less, particularly preferably 500 or less, and most preferably 200 or less. As the molecular weight of the residue removing accelerator, a value of the weight average molecular weight (Mw) measured by gel permeation chromatography (GPC) is adopted with respect to the (co)polymer such as substituted or unsubstituted polyalkylene glycol, or the like. With respect to others, the value calculated from the sum of atomic weight is adopted.

As the residue removing accelerator, a synthetic product may be used or a commercially available product may be used. Examples of commercially available products include, but are not particularly limited to, Pronon (registered trademark) #104, Uniox (registered trademark) G450, Nonion ID 203, Nonion L-2 (manufactured by NOF CORPORATION), and the like.

These residue removing accelerators may be used alone or in combination of two or more kinds.

The lower limit value of the content of the residue removing accelerator in the surface treatment composition is preferably 0.001 g/L or more. Within this range, the amount of the residue removing accelerator is more sufficient, and the effect of the present invention is further improved. From the same viewpoint, the lower limit value of the content of the residue removing accelerator is more preferably 0.1 g/L or more, further more preferably 1 g/L or more, and particularly 3 g/L or more. In addition, the upper limit value of the content of the residue removing accelerator in the surface treatment composition is preferably 50 g/L or less. Within this range, it is easier to remove the residue removing accelerator after the surface treatment, and thus a possibility that the residue removing accelerator itself will remain as an organic residue is further reduced. From the same viewpoint, the lower limit value of the content of the residue removing accelerator is more preferably 10 g/L or less, further more preferably 8 g/L or less, and particularly 5 g/L or less.

(A Compound Having a Partial Structure Represented by $SO_x$ or $NO_y$ (Where x and y are Each Independently a Real Number of 1 to 5))

The surface treatment composition according to an embodiment of the present invention preferably further includes a compound having a partial structure represented by $SO_x$ or $NO_y$ (where x and y are each independently a real number of 1 to 5) (also referred to as "$SO_x$ or $NO_y$ partial structure-containing compound" in the present specification). The $SO_x$ or $NO_y$ partial structure-containing compound has an action to make removal of ceria residue easier.

In a mixture of two or more inorganic acids or salts thereof, or a mixture of sulfur oxides or nitrogen oxides, in which the type of constituent element is the same, only the valence or number of sulfur atoms (S) or nitrogen atoms (N), the number of hydrogen atoms (H), or the number of oxygen atoms (O) is different, x and y represent an average value thereof. For example, peroxo 1 sulfuric acid ($H_2SO_5$) is regarded as a compound having a partial structure in which x of $SO_x$ is 5, and an equimolar mixture ($H_2SO_{4.5}$) of peroxo 1 sulfuric acid ($H_2SO_5$) and peroxo 2 sulfuric acid ($H_2S_2O_8$) is regarded as a compound having a partial structure in which x of $SO_x$ is 4.5.

In the present specification, when the carboxy structural unit-containing (co) polymer as described above has a partial structure represented by $SO_x$ or $NO_y$ (where x and y are each independently a real number of 1 to 5), this compound is regarded as a carboxy structural unit-containing (co) polymer.

The $SO_x$ or $NO_y$ partial structure-containing compound is not particularly limited, but for example, includes at least one compound selected from the group consisting of sulfurous acid and a salt thereof, sulfuric acid and a salt thereof, persulfuric acid and a salt thereof, a compound having a sulfonic acid group and a salt group thereof (also referred to as sulfonic acid (salt) group-containing compound), nitrous acid and a salt thereof, nitric acid and a salt thereof, pernitric acid and a salt thereof, and a nitro group-containing compound, and the like. Among them, at least one compound selected from the group consisting of sulfites, sulfates, persulfates, sulfonic acid (salt) group-containing compounds, nitrites, nitrates, pernitrates, and nitro group-containing compounds is preferable, at least one compound selected from the group consisting of sulfates, sulfonic acid (salt) group-containing compounds, nitrates, and nitro group-containing compounds is more preferable, and the sulfonic acid (salt) group-containing compound is further more preferable.

The sulfonic acid (salt) group-containing compound is not particularly limited, but includes at least one compound selected from the group consisting of a compound represented by the following Chemical Formula (1) and a salt thereof, a compound represented by the following Chemical Formula (2) and a salt thereof, and the like, as preferable examples.

[Chemical Formula 1]

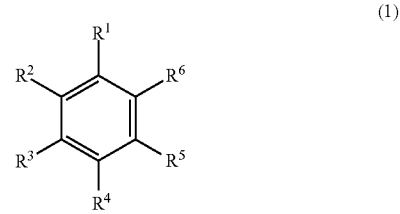

(1)

(In Chemical Formula (1) above, $R^1$ to $R^6$ are each independently a hydrogen atom, a hydroxyl group, a sulfo group, an anionic group not containing a sulfo group, a cationic group, an alkoxycarbonyl group having 2 to 12 carbon atoms, or a hydrocarbon group having 1 to 10 carbon atoms, wherein at least one of $R^1$ to $R^6$ is a sulfo group).

[Chemical Formula 2]

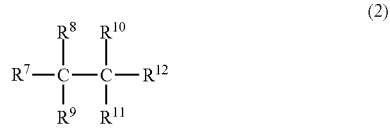

(In Chemical Formula (2) above, $R^7$ to $R^{12}$ are each independently a hydrogen atom, a hydroxyl group, a sulfo group, an anionic group not containing a sulfo group, a cationic group, an alkoxycarbonyl group having 2 to 12 carbon atoms, or a hydrocarbon group having 1 to 10 carbon atoms, wherein at least one of $R^7$ to $R^{12}$ is a sulfo group).

In the present specification, the anionic group means a functional group that generates anionic species (to be an anion) by dissociating the counter ion, and the cationic group means a functional group that generates cationic species (to be an cation) by dissociating the counter ion or that binds to a cationic species generated by ionization of another ionic compound to generate a cationic species (to be a cation).

The compound represented by the above Chemical Formula (1) or a salt thereof is preferably a compound in which in the Formula (1), $R^1$ is a sulfo group, $R^2$ to $R^6$ are each independently a hydrogen atom, a hydroxyl group, an anionic group not containing a sulfo group, a cationic group, an alkoxycarbonyl group having 2 to 6 carbon atoms, or a hydrocarbon group having 1 to 10 carbon atoms or a salt thereof. In addition, the compound represented by the above Chemical Formula (1) or a salt thereof is more preferably a compound in which in the Formula (1), $R^1$ is a sulfo group, $R^2$ to $R^6$ are each independently a hydrogen atom, a hydroxyl group, a carboxyl group, a phosphate group, an amino group, an alkoxycarbonyl group having 2 to 6 carbon atoms, or a hydrocarbon group having 1 to 10 carbon atoms or a salt thereof. Further, the compound represented by the above Chemical Formula (1) or a salt thereof is further more preferably a compound in which in the Formula (1), $R^1$ is a sulfo group, $R^2$ to $R^6$ are each independently a hydrogen atom, an amino group, or a hydrocarbon group having 1 to 10 carbon atoms or a salt thereof.

The compound represented by the above Chemical Formula (2) or a salt thereof is preferably a compound in which in Formula (2), $R^7$ is a sulfo group, $R^8$ to $R^{12}$ are each independently a hydrogen atom, a hydroxyl group, an anionic group not containing a sulfo group, a cationic group, an alkoxycarbonyl group having 2 to 12 carbon atoms, or a hydrocarbon group having 1 to 10 carbon atoms or a salt thereof. In addition, the compound represented by the above Chemical Formula (2) or a salt thereof is more preferably a compound in which in the Formula (2), $R^7$ is a sulfo group, $R^8$ to $R^{12}$ are each independently a hydrogen atom, a hydroxyl group, a carboxyl group, a phosphate group, an amino group, an alkoxycarbonyl group having 2 to 12 carbon atoms, or a hydrocarbon group having 1 to 10 carbon atoms or a salt thereof. Further, the compound represented by the above Chemical Formula (2) or a salt thereof is further more preferably a compound in which in the Formula (2), $R^7$ is a sulfo group, $R^8$ to $R^{11}$ are a hydrogen atom, $R^{12}$ is a hydroxyl group or a salt thereof, or a compound in which $R^7$ is a sulfo group, $R^8$ and $R^{10}$ are an alkoxycarbonyl group having 2 to 12 carbon atoms, and $R^9$, $R^{11}$ and $R^{12}$ are a hydrogen atom or a salt thereof.

In the above Formula (1) or (2), the amino group represents —$NH_2$ group, —NHR group, or —NRR' group (R and R' represent substituents), but among them, —$NH_2$ group is preferable. In addition, examples of the alkoxycarbonyl group having 2 to 12 carbon atoms include preferably a methoxycarbonyl group, an ethoxycarbonyl group, an n-propyloxycarbonyl group, an isopropyloxycarbonyl group, an n-butoxycarbonyl group, a sec-butoxycarbonyl group, a tert-butoxycarbonyl group, a 2-ethylhexyloxycarbonyl group, and more preferably a methoxycarbonyl group, a 2-ethylhexyloxycarbonyl group, and further more preferably a 2-ethylhexyloxycarbonyl group. In addition, the hydrocarbon group having 1 to 10 carbon atoms is preferably a methyl group, an ethyl group, an n-propyl group, an isopropyl group, an n-butyl group, a sec-butyl group or a tert-butyl group, and is more preferably a methyl group.

The upper limit value of the molecular weight of the $SO_x$ or $NO_y$ partial structure-containing compound is particularly preferably less than 1,000. Within this range, it is easier to remove the $SO_x$ or $NO_y$ partial structure-containing compound after the surface treatment, and thus a possibility that the $SO_x$ or $NO_y$ partial structure-containing compound itself will remain as an organic residue is further reduced.

Further, the $SO_x$ or $NO_y$ partial structure-containing compound is not particularly limited, but for example, includes sulfate, isethionic acid or a salt thereof, m-xylene sulfonic acid or a salt thereof, 1-naphthalene sulfonic acid or a salt thereof, 2-naphthol-6-sulfonic acid or a salt thereof, p-toluidine-2-sulfonic acid or a salt thereof, benzenesulfonic acid or a salt thereof, dodecylbenzene sulfonic acid or a salt thereof, di(2-ethylhexyl)sulfosuccinic acid or a salt thereof, nitrate, 2-hydroxymethyl-2-nitro-1,3-propanediol, 4,6-dinitroresorcinol, 2-nitro-p-xylylene glycol, and the like. Among them, sulfate, isethionic acid or a salt thereof, m-xylene sulfonic acid or a salt thereof, 1-naphthalene sulfonic acid or a salt thereof, 2-naphthol-6-sulfonic acid or a salt thereof, di(2-ethylhexyl) sulfosuccinate or a salt thereof is preferable, and isethionic acid or a salt thereof, m-xylene sulfonic acid or a salt thereof, di(2-ethylhexyl) sulfosuccinic acid or a salt thereof is more preferable.

The $SO_x$ or $NO_y$ partial structure-containing compound may be in the form of salt (including partial salt). Examples of the salt include alkali metal salts such as sodium salts, potassium salts, and the like, salts of Group 2 elements such as calcium salts, magnesium salts, and the like, amine salts, ammonium salts, and the like. Among them, sodium salts or ammonium salts are preferable, and sodium salts are particularly preferable.

The $SO_x$ or $NO_y$ partial structure-containing compound according to an embodiment of the present invention may be in the state of the $SO_x$ or $NO_y$ partial structure-containing compound itself, or may be in the state of a hydrate thereof.

The lower limit value of the content of the $SO_x$ or $NO_y$ partial structure-containing compound in the surface treatment composition is preferably 0.01 g/L or more. Within this range, an effect of removing ceria residue such as abrasive grains included in the polishing composition is further improved. From the same viewpoint, the lower limit value of the content of the $SO_x$ or $NO_y$ partial structure-containing compound is more preferably 0.01 g/L or more, and further more preferably 0.1 g/L or more. Further, the upper limit value of the content of the $SO_x$ or $NO_y$ partial structure-containing compound in the surface treatment composition is preferably 100 g/L or less. Within this range, removal of the $SO_x$ or $NO_y$ partial structure-containing compound becomes easier, and thus a possibility that the $SO_x$ or $NO_y$ partial structure-containing compound itself after surface treatment will remain as a defect is further reduced. From the same viewpoint, the upper limit value of the content of the $SO_x$ or $NO_y$ partial structure-containing compound is more preferably 10 g/L or more, and further more preferably 5 g/L or more.

In addition, in the case where the $SO_x$ or $NO_y$ partial structure-containing compound is mixed in the form of a hydrate when mixing the $SO_x$ or $NO_y$ partial structure-containing compound in preparing the surface treatment composition, the preferable content of the $SO_x$ or $NO_y$ partial structure-containing compound is regarded as a content calculated from the mass excluding hydration water.

(Abrasive Grain)

A surface treatment composition according to an embodiment of the present invention preferably further includes an abrasive grain. The abrasive grain has a function of mechanically cleaning the object to be surface treated, and further improves an effect of removing the defect by the surface treatment composition.

The lower limit value of an average primary particle size of the abrasive grain in the surface treatment composition is preferably 5 nm or more. Within this range, the effect of removing the defect obtained by the surface treatment composition is further improved by further improving energy for removing the defect obtained by the abrasive grain. From this, the lower limit value of the average primary particle size of the abrasive grain in the surface treatment composition is more preferably 7 nm or more, and further more preferably 10 nm or more. Further, the upper limit value of the average primary particle size of the abrasive grains in the surface treatment composition is preferably 50 nm or less. Within this range, a contact area between the abrasive grain and the surface treatment composition is further increased, thereby further improving the effect of removing the defect obtained by the surface treatment composition. Accordingly, the upper limit value of the average primary particle size of the abrasive grains in the surface treatment composition is more preferably 45 nm or less, and further more preferably 40 nm or less. In addition, the value of the average primary particle size of the abrasive grain is calculated, for example, based on the specific surface area of the abrasive grain measured by a BET method.

An average secondary particle size of the abrasive grain in the surface treatment composition is preferably 10 nm or more, more preferably 15 nm or more, and further more preferably 20 nm or more. As the average secondary particle size of the abrasive grain increases, the energy for removing the defect obtained by the abrasive grain is further improved, and thus a cleaning effect by the surface treatment composition is further improved. The average secondary particle size of the abrasive grain in the surface treatment composition is preferably 100 nm or less, more preferably 90 nm or less, and furthermore preferably 80 nm or less. As the average secondary particle size of the abrasive grain decreases, the contact area of the abrasive grain and the surface treatment composition is further improved, and thus a cleaning effect by the surface treatment composition is further improved. In addition, the value of the average secondary particle size of the abrasive grain is calculated, for example, based on the specific surface area of the abrasive grain measured by a light scattering method using laser light.

The abrasive grain is not particularly limited as long as it is other than those including ceria, and may be any one of an inorganic particle, an organic particle, and an organic-inorganic composite particle. Examples of the inorganic particle include, for example, a particle formed of metal oxide such as silica, alumina, titania, or the like, a silicon nitride grain, a silicon carbide grain, a boron nitride grain, and the like. Specific examples of the organic particle include, for example, a polymethylmethacrylate (PMMA) particle. Among them, from the viewpoint of easy availability and cost, silica is preferable, and colloidal silica is more preferable. Further, these abrasive grains may be used alone, or in combination of two or more kinds. In addition, as the abrasive grain, commercially available products or synthesized products may be used.

The abrasive grains may be surface-modified. In general colloidal silica, a value of zeta potential is close to zero under acidic conditions, and thus silica particles do not electrically repel each other under acidic conditions and are likely to aggregate. On the other hand, the abrasive grain surface-modified so that the zeta potential has a relatively large negative value even under acidic conditions strongly repel each other under acidic conditions and is well dispersed, and as a result, a polishing speed and storage stability of the surface treatment composition can be further improved. Among them, silica (organic acid-modified silica) having an organic acid immobilized on its surface is particularly preferable.

Silica having an organic acid immobilized on the surface includes fumed silica, colloidal silica, or the like, and colloidal silica is particularly preferable. The organic acid is not particularly limited, but can include sulfonic acid, carboxylic acid, phosphoric acid, and the like, and preferably sulfonic acid or carboxylic acid. In addition, on the surface of the silica on which the organic acid included in the surface treatment composition of the present invention is immobilized, an acidic group (for example, a sulfo group, a carboxyl group, a phosphate group, and the like) derived from the organic acid is immobilized by a covalent bond (in some cases via a linker structure).

A method for introducing these organic acids to the silica surface is not particularly limited, and known methods can be appropriately used. For example, paragraphs "0020" and "0021" of JP 2014-99565 A, paragraphs "0020" and "0021" of JP 2016-69622 A, and the like can be referred.

When the abrasive grain is included in the surface treatment composition, the lower limit value of the content of abrasive grain in the surface treatment composition is preferably 0.01 g/L or more, more preferably 0.1 g/L or more, and further more preferably 0.5 g/L or more. As the content of the abrasive grains increases, the effect of removing the defects of the object to be polished caused by the surface treatment composition is further improved. The content of abrasive grain in the surface treatment composition is preferably 10 g/L or less, more preferably 5 g/L or less, and further more preferably 2.5 g/L or less. As the content of abrasive grain decreases, the number of particle residues not derived from ceria or the number of other residues is further reduced.

(pH Adjusting Agent)

The surface treatment composition according to an embodiment of the present invention preferably further includes a pH adjusting agent for adjusting the pH value to a desired pH value.

In addition, in the present specification, the above-described "carboxy structural unit-containing (co) polymer" and the "$SO_x$ or $NO_y$ partial structure-containing compound" is regarded as being not included in the pH adjusting agent.

The pH adjusting agent is not particularly limited, and known pH adjusting agents used in the field of the surface treatment composition can be used. Among them, it is preferable to use known acids, bases, salts, amines, chelating agents, and the like. Examples of pH adjusting agent may include carboxylic acids such as formic acid, acetic acid, propionic acid, butyric acid, valeric acid, caproic acid, enanthic acid, caprylic acid, pelargonic acid, capric acid, lauric acid, myristic acid, palmitic acid, margaric acid, stearic acid, oleic acid, linoleic acid, linolenic acid, arachidonic acid, docosahexaenoic acid, eicosapentaenoic acid, lactic acid, malic acid, citric acid, benzoic acid, phthalic acid, isophthalic acid, terephthalic acid, salicylic acid, gallic acid, melitic acid, cinnamic acid, oxalic acid, malonic acid, succinic acid, glutaric acid, adipic acid, fumaric acid, maleic acid, aconitic acid, amino acid, anthranilic acid, and the like; inorganic acids such as carbonic acid, hydrochloric acid, phosphoric acid, hypophosphorous acid, phosphorous acid, phosphonic acid, boric acid, hydrofluoric acid, orthophosphoric acid, pyrophosphoric acid, polyphosphoric acid, metaphosphoric acid, hexametaphosphoric acid, and the like; alkali metal hydroxides such as potassium hydroxide (KOH), and the like; hydroxides of Group 2 element; ammonia (ammonium hydroxide); organic bases such as quaternary ammonium hydroxide; amines such as aliphatic amine and aromatic amine; chelating agents such as iminodiacetic acid (iminodiacetic acid), nitrilotriacetic acid, diethylenetriaminepentaacetic acid, ethylenediaminetetraacetic acid, N,N,N-trimethylenephosphonic acid, transcyclohexanediaminetetraacetic acid, 1,2-diaminopropanetetraacetic acid, glycol ether diaminetetraacetic acid, ethylenediamine orthohydroxyphenylacetic acid, ethylenediamine disuccinic acid (SS form), N-(2-carboxylate ethyl)-L-aspartic acid, β-alaninediacetic acid, 2-phosphonobutane-1,2,4-tricarboxylic acid, 1-hydroxyethylidene-1,1-diphosphonic acid, N,N'-bis(2-hydroxybenzyl)ethylenediamine-N,N'-diacetic acid, polyamine, polyphosphonic acid, polyaminocarboxylic acid, polyaminophosphonic acid, and the like. These pH adjusting agents can be used alone or in combination of two or more kinds.

Among these pH adjusting agents, ammonia, quaternary ammonium hydroxide, potassium hydroxide, acetic acid, citric acid, malonic acid, iminodiacetic acid or maleic acid is preferable.

The pH adjusting agent is preferably a combination of an acid and a base, and is more preferably a combination of ammonia, quaternary ammonium hydroxide or potassium hydroxide and acetic acid, citric acid, malonic acid, iminodiacetic acid or maleic acid, and further more preferably a combination of ammonia and acetic acid, citric acid, malonic acid, iminodiacetic acid or maleic acid, and particularly preferably a combination of ammonia and iminodiacetic acid or maleic acid.

The content of the pH adjusting agent in the surface treatment composition may be appropriately selected so as to have the desired pH value of the surface treatment composition, and is preferably added so as to obtain a desirable pH value of the surface treatment composition to be described below.

(Other Additives)

In the surface treatment composition according to an embodiment of the present invention, within the range not inhibiting the effect of the present invention, other additives may be contained at an arbitrary ratio, if necessary. However, since components other than essential components of the surface treatment composition according to an embodiment of the present invention may cause defects, it is preferable not to add as much as possible, and thus, an addition amount thereof is preferably as small as possible, and more preferably, the components other than the essential components are not included. Other additives include, for example, wetting agents, antiseptic agents, dissolved gases, reducing agents, oxidizing agents, and alkanolamines, and the like.

(Dispersing Medium)

The surface treatment composition according to an embodiment of the present invention includes a dispersing medium (solvent). The dispersing medium has a function of dispersing or dissolving each component. The dispersing medium preferably contains water, and more preferably water alone. Further, the dispersing medium may be a mixed solvent of water and an organic solvent for dispersing or dissolving each component. In this case, examples of the organic solvent to be used include acetone, acetonitrile, ethanol, methanol, isopropanol, glycerin, ethylene glycol, propylene glycol, and the like, which are organic solvents mixed with water. Further, these organic solvents may be used without being mixed with water, and after dispersing or dissolving each component, the organic solvents may be mixed with water. These organic solvents may be used alone or in combination of two or more kinds thereof.

Water is preferably water which does not contain impurities as much as possible from the viewpoint of inhibiting contamination of the object to be surface treated and action of other components. For example, water having a total content of transition metal ions of 100 ppb or less is preferable. Here, purity of water can be increased by, for example, removal of impurity ions using an ion exchange resin, removal of foreign materials by a filter, distillation, and the like. Specifically, it is preferable to use deionized water (ion exchanged water), pure water, ultrapure water, distilled water, or the like, as the water.

(pH Value)

The upper limit value of the pH of the surface treatment composition according to an embodiment of the present invention is less than 7. When the pH value of the surface treatment composition is 7 or more, the action effect of the present invention cannot be exhibited, and thus, the ceria residue such as abrasive grains and the like, included in the polishing composition, organic compounds included in the polishing composition, or organic residue derived from pad debris, and the like, cannot be removed satisfactorily. From the same viewpoint, the upper limit value of the pH of the surface treatment composition is preferably 6 or less, and more preferably 5 or less. In addition, the lower limit value of the pH of the surface treatment composition is preferably 1 or more. Within this range, the possibility that consumable members such as a polishing apparatus, a contacting polishing pad, and the like, are deteriorated is further decreased, and the possibility of occurrence of residues and scratches due to a product caused by the deterioration is further decreased. From the same viewpoint, the lower limit value of the pH of the surface treatment composition is preferably 2 or more, and more preferably 3 or more. In addition, the pH value of the surface treatment composition can be checked by a pH meter (product name: LAQUA (registered trademark) manufactured by HORIBA, Ltd.).

(Object to be Surface Treated)

The object to be surface treated is preferably a polished object to be polished which is obtained after polishing with a polishing composition including ceria. The polished object to be polished means an object to be polished after being polished in the polishing step. The polishing step is not particularly limited, but preferably a CMP step.

The polished object to be polished is preferably a polished semiconductor substrate, and more preferably a semiconductor substrate after CMP. Here, defects, particularly, ceria residue and organic residue, can cause a decrease in performance of the semiconductor device. Therefore, when the polished object to be polished is the polished semiconductor substrate, it is preferable to reduce these defects as much as possible in the surface treatment step of the semiconductor substrate. Since the surface treatment composition according to an embodiment of the present invention has a sufficient effect of removing the defects, it can be preferably used for surface treatment (cleaning, etc.) of the polished semiconductor substrate.

The surface treatment composition according to an embodiment of the present invention is not particularly limited, but since the action effect of the present invention is exhibited more satisfactorily, the surface treatment composition is applied to a polished object to be polished including silicon nitride, silicon oxide or polysilicon, and more preferably applied to a polished object to be polished containing silicon nitride.

Examples of the polished object to be polished containing silicon nitride, silicon oxide or polysilicon may include a polished object to be polished consisting of silicon nitride, silicon oxide and polysilicon alone, or a polished object to be polished in a state where materials other than silicon nitride, silicon oxide or polysilicon are exposed on the surface, or the like, as well as silicon nitride, silicon oxide or polysilicon. Here, examples of the former include a silicon nitride substrate, a silicon oxide substrate, or a polysilicon substrate which is a semiconductor substrate, a substrate having a silicon nitride film, a silicon oxide film or a polysilicon film formed on the outermost surface, and the like. Further, regarding the latter, a material other than silicon nitride, silicon oxide or polysilicon is not particularly limited, but examples thereof include tungsten, and the like. A specific example thereof may include a polished semiconductor substrate having a structure in which a silicon nitride film or a silicon oxide film is formed on tungsten or a polished semiconductor substrate having a structure in which a tungsten portion, a silicon nitride film and a silicon oxide film are exposed on the outermost surface, and the like.

Further, as the polished object to be polished containing silicon oxide, for example, a TEOS type silicon oxide film formed by using tetraethyl orthosilicate as a precursor (hereinafter also simply referred to as "TEOS"), an HDP film, a USG film, a PSG film, a BPSG film, an RTO film, and the like, can be included <Preparation Method of Surface Treatment Composition>

Another embodiment of the present invention relates to a preparation method of a surface treatment composition including mixing a carboxy structural unit-containing (co) polymer, a residue removing accelerator, and a dispersing medium. In the preparation method of the surface treatment composition according to an embodiment of the present invention, the abrasive grains, the $SO_x$ or $NO_y$ partial structure-containing compound, the pH adjusting agent, other additives, and the like, may be further mixed. Details of various additives to be added are as described above.

In the present specification, the mixing of the $SO_x$ or $NO_y$ partial structure-containing compound includes mixing in the state of hydrates thereof in addition to mixing in the state of the $SO_x$ or $NO_y$ partial structure-containing compound itself.

Mixing methods such as mixing conditions thereof, mixing order, and the like, are not particularly limited, and known mixing methods can be used.

In addition, when using the pH adjusting agent, a step of adding the pH adjusting agent may be "adjusting the pH to less than 7" in the preparation method according to an embodiment of the present invention. In addition, adjustment to another preferred pH range is similar. However, the pH adjustment method is not limited thereto.

A temperature at which each component is mixed is not particularly limited, but preferably from 10 to 40° C., and each component may be heated for increasing a rate of dissolution.

<Surface Treatment Method>

(Surface Treatment)

Yet another embodiment of the present invention relates to a surface treatment method including surface-treating an object to be surface treated (polished object to be polished) using the surface treatment composition. In the present specification, the surface treatment method is a method of reducing defects on the surface of the object to be surface treated, and is a method of performing cleaning in a broad sense.

According to the surface treatment method according to an embodiment of the present invention, removal of defects can be facilitated in the polished object to be polished which is obtained after polishing with a polishing composition including ceria. That is, according to another embodiment of the present invention, there is provided a method for reducing defects on the surface of the polished object to be polished which is obtained after polishing with the polishing composition including ceria, by surface-treating the polished object to be polished using the surface treatment composition.

The surface treatment method according to an embodiment of the present invention is performed by a method of bringing a surface treatment composition according to the present invention into direct contact with the object to be surface treated.

As the surface treatment method, (I) a method by rinse polishing treatment and (II) a method by cleaning treatment, and the like, may be mainly included. That is, the surface treatment according to an embodiment of the present invention is preferably performed by a rinse polishing treatment or a cleaning treatment. The rinse polishing treatment and the cleaning treatment are performed in order to remove defects on the surface of the object to be surface treated, in particular, ceria residue (in particular particle residue derived from ceria) and organic residue to obtain a clean surface. The above (I) and (II) are described below.

(I) Rinse Polishing Treatment

The surface treatment composition according to an embodiment of the present invention is preferably used in a rinse polishing treatment. That is, the surface treatment composition according to an embodiment of the present invention can be preferably used as a rinse polishing composition. The rinse polishing treatment is preferably performed on a polishing table (platen) to which a polishing pad is attached for the purpose of removing the defects on the surface of the polished object to be polished, after final polishing (finish polishing) is performed on the object to be polished. At this time, the rinse polishing treatment is performed by bringing the rinse polishing composition into direct contact with the object to be surface treated. As a result, the defects on the surface of the object to be surface treated are removed by frictional force (physical action) by the polishing pad and chemical action by the rinse polishing composition. Among the defects, particle residue and organic residue, in particular, are easily removed by physical action. Therefore, in the rinse polishing treatment, by using friction with the polishing pad on the polishing table (platen), the particle residue and the organic residue can be effectively removed.

Specifically, the rinse polishing treatment may be performed by placing the surface after the polishing step on the polishing table (platen) of the polishing apparatus, bringing the polishing pad and the object to be surface treated into contact with each other, and relatively sliding the object to be surface treated and the polishing pad while supplying the rinse polishing composition to a contact portion.

As the polishing apparatus, a general polishing apparatus in which a holder for holding an object to be polished and a motor capable of changing rotation speed, or the like, are mounted, and a polishing table capable of attaching a polishing pad (polishing cloth) is provided, can be used.

The rinse polishing treatment can be performed using either a single side polishing apparatus or a double side polishing apparatus. In addition, the polishing apparatus preferably includes not only a discharge nozzle of the polishing composition but also a discharge nozzle for the rinse polishing composition. Specifically, as the polishing apparatus, for example, a cleaning apparatus integrated type polishing apparatus which is MirraMesa manufactured by Applied Materials, Inc., or the like, can be preferably used.

As the polishing pad, a general nonwoven fabric, polyurethane, and a porous fluoro resin, and the like, can be used without particular limitation. It is preferable that the polishing pad is subjected to a groove process in which the rinse polishing composition is gathered.

There is no particular limitation on rinse polishing conditions, for example, the rotation speed of the polishing table, and the rotation speed of the head (carrier) are preferably 10 rpm or more to 100 rpm or less. Further, for example, the pressure (polishing pressure) applied to the object to be polished is preferably 0.5 psi or more to 10 psi or less. A method for supplying the polishing composition to the polishing pad is not particularly limited. For example, a method for continuously supplying (flowing) the polishing composition by a pump, or the like, is employed. A supply amount thereof is not limited, but it is preferable that the surface of the polishing pad is always covered with the rinse polishing composition, and the supply amount is preferably 10 mL/min or more to 5000 mL/min or less. The polishing time is not particularly limited, but a step using the rinse polishing composition is preferably from 5 seconds or more to 180 seconds or less.

As the rinse polishing treatment, it is preferable to use water (preferably, deionized water) as the rinse polishing composition to perform a rinse polishing treatment under the same conditions as the rinse polishing treatment as the above-described surface treatment method, and then to use the surface treatment composition according to an embodiment of the present invention as the rinse polishing composition to perform the rinse polishing treatment under the above-described rinse polishing treatment conditions. Here, the rinse polishing treatment with water and the rinse polishing treatment with the surface treatment composition according to an embodiment of the present invention may be performed by using the same polishing table, or by using different polishing tables. In addition, in the case of performing the rinse polishing treatment with water and the rinse polishing treatment with the surface treatment composition according to an embodiment of the present invention by using the same polishing table, before the next polishing is performed, it is preferable to perform pad conditioning for 5 seconds or more with pure water to remove the rinse polishing composition and then clean the polishing pad.

After the rinse polishing treatment using the surface treatment composition according to an embodiment of the present invention, the object to be surface treated is preferably pulled up and taken out while applying the surface treatment composition according to an embodiment of the present invention.

(II) Cleaning Treatment

The surface treatment composition according to an embodiment of the present invention is preferably used in a cleaning treatment. That is, the surface treatment composition according to an embodiment of the present invention can be preferably used as a cleaning composition. After the final polishing (finish polishing) is performed on the object to be polished, or after the rinse polishing treatment with the surface treatment composition according to an embodiment of the present invention or another rinse polishing composition is performed on the object to be polished, the cleaning treatment is performed for removing defects on the surface of the polished object to be polished. In addition, the cleaning treatment and the rinse polishing treatment are classified according to a place where these treatments are performed, the cleaning treatment is a surface treatment performed at a place other than the polishing table (platen), and is preferably performed after separating the object to be surface treated from the polishing table (platen). Even in the cleaning treatment, defects on the surface of the corresponding object can be removed by bringing the cleaning composition into direct contact with the object to be surface treated.

Examples of a method of performing the cleaning treatment can include (i) a method of bringing a cleaning brush into contact with a single side or double sides of an object to be surface treated while holding the object to be surface treated, supplying a cleaning composition to the contact portion, and rubbing the surface of the object to be surface treated with the cleaning brush, (ii) a method (dipping method) of immersing the object to be surface treated in the cleaning composition, and performing ultrasonic treatment or stirring, etc. In this method, the defects on the surface of the object to be polished are removed by frictional force caused by the cleaning brush, mechanical force generated by ultrasonic treatment or stirring, and chemical action by the surface treatment composition. In the above method (i), the method of bringing the cleaning composition into contact with the object to be surface treated is not particularly limited, but may include a spin type in which the object to be surface treated is rotated at a high speed while flowing the cleaning composition onto the object to be surface treated from a nozzle, and a spray type in which the cleaning composition is sprayed to clean the object to be surface treated, and the like.

An apparatus for performing the cleaning treatment is not particularly limited, but for example, is preferably a polishing apparatus provided with a cleaning facility capable of rubbing the corresponding object with the cleaning brush after separating the object to be surface treated from the polishing table (platen). By using the polishing apparatus, it is possible to more efficiently perform the cleaning treatment of the object to be surface treated. As the polishing apparatus, it is possible to use a general polishing apparatus having a holder for holding the object to be surface treated, a motor capable of changing the rotation speed, a cleaning brush, and the like. As a polishing apparatus, any one of a single side polishing apparatus or a double side polishing apparatus may be used. In addition, when the rinse polishing step is performed after the CMP step, it is more efficient and preferable to perform the cleaning treatment using the same apparatus as the polishing apparatus used in the rinse polishing step. The cleaning brush is not particularly limited, but is preferably a resin brush. A material of the resin brush is not particularly limited, but for example, polyvinyl alcohol (PVA) is preferable. That is, it is particularly preferable to use a PVA-made sponge as the cleaning brush. Cleaning conditions are also not particularly limited, and can be appropriately determined according to a type of the object to be surface treated, and a kind and an amount of the defect to be removed.

When the cleaning treatment (II) is performed using the cleaning composition which is a surface treatment composition according to an embodiment of the present invention, the object to be surface treated is preferably an object after the rinse polishing treatment is performed.

Cleaning with water may be performed before the surface treatment by the method (I) or (II) is performed.

(Post-Cleaning Treatment)

In addition, as the surface treatment method, it is preferable to additionally perform cleaning treatment on the polished object to be polished after the surface treatment of (I) or (II) using the surface treatment composition according to an embodiment of the present invention. In the present specification, this cleaning treatment is referred to as a post-cleaning treatment. As the post-cleaning treatment, for example, a method in which water or a cleaning composition different from the surface treatment composition according to the present invention (hereinafter, also referred to as a post-cleaning composition) simply flows to the object to be surface treated; a method in which the object to be surface treated is immersed in water or the post-cleaning composition, and the like, can be included. Further, similar to the surface treatment by the method (II) described above, examples of the post-cleaning treatment can include a method of bringing a cleaning brush into contact with a single side or double sides of an object to be surface treated while holding the object to be surface treated, supplying water or the post-cleaning composition to the contact portion, and rubbing the surface of the object to be surface treated with the cleaning brush, a method (dipping method) of immersing the object to be surface treated in water or the post-cleaning composition, and performing ultrasonic treatment or stirring, etc. Among them, the method of bringing the cleaning brush into contact with a single side or double sides of an object to be surface treated while holding the object to be surface treated, supplying water or the post-cleaning composition to the contact portion, and rubbing the surface of the object to be surface treated with the cleaning brush is preferable. In addition, as the apparatus and conditions for post-cleaning treatment, the same apparatus and conditions as those described for the surface treatment of (II) can be used. Here, water or a known cleaning composition can be used as the water or post-cleaning composition used in post-cleaning treatment, but among them, water, particularly, deionized water is preferably used. By the surface treatment according to an embodiment of the present invention, the ceria residue and the organic residue tend to be extremely easily removed. Therefore, after the surface treatment of an embodiment of the present invention, new cleaning treatment is further performed using water or the post-cleaning composition, and thus the ceria residue and the organic residue are extremely satisfactorily removed.

In addition, the object to be surface treated after cleaning is preferably dried by removing water-droplets adhered to the surface by a spin dryer, or the like. Further, the surface of the object to be surface treated may be dried by air blow drying.

(Polishing Treatment of Object to be Polished With Polishing Composition Including Ceria)

The surface treatment method according to an embodiment of the present invention is a surface treatment method including surface-treating the object to be surface treated (polished object to be polished) obtained after polishing with the polishing composition including ceria. Thus, the polished object to be polished according to an embodiment of the present invention is more preferably a polished object to be polished which is obtained by polishing the object to be polished by the polishing method to be described below before performing the surface treatment.

The polishing treatment is not particularly limited as long as it is a treatment of polishing an object to be polished, but is preferably a chemical mechanical polishing (CMP) step. Further, the polishing treatment may be a polishing treatment performed by a single step or a polishing treatment performed by a plurality of steps. Examples of the polishing treatment performed by a plurality of steps include a polishing treatment in which a finish polishing step is performed after a preliminary polishing step (rough polishing step), or a polishing treatment in which after a primary polishing step, a secondary polishing step is performed once or twice or more, and then a finish polishing step is performed, and the like. The surface treatment step using the surface treatment composition according to an embodiment of the present invention is preferably performed after the above finish polishing.

As the polishing composition, a known polishing composition can be used appropriately depending on characteristics of the object to be polished, as long as it is a polishing composition including ceria, which is a prerequisite for obtaining the action effect of the surface treatment method according to an embodiment of the present invention. As a specific example of the polishing composition, a polishing composition containing 1.0 mass % of MIREK E05 (by Mitsui Mining & Smelting Co., Ltd.), and 0.1 mass % of sodium polyacrylate (weight average molecular weight of 10000) in water as a dispersing medium and having pH=4 adjusted with acetic acid, or the like, can be included.

As a polishing apparatus, a general polishing apparatus in which a holder for holding an object to be polished, a motor capable of changing rotation speed, and the like are mounted, and a polishing table capable of attaching a polishing pad (polishing cloth) is provided, can be used. As the polishing apparatus, any one of a single side polishing apparatus or a double side polishing apparatus may be used. Specifically, for example, a cleaning apparatus integrated type polishing apparatus which is MirraMesa manufactured by Applied Materials Inc., can be preferably used. Here, as the polishing apparatus used for the polishing treatment, it is more efficient and preferable to use the same polishing apparatus as that used in the rinse polishing treatment described above.

As the polishing pad, a general nonwoven fabric, polyurethane, and a porous fluororesin, and the like, can be used without particular limitation. It is preferable that the polishing pad is subjected to a groove process in which the polishing composition is gathered.

There is no particular limitation on polishing conditions, for example, the rotation speed of the polishing table and the rotation speed of the head (carrier) are preferably 10 rpm or more and 100 rpm or less. Further, for example, the pressure (polishing pressure) applied to the object to be polished is preferably 0.5 psi or more to 10 psi or less. A method for supplying the polishing composition to the polishing pad is not particularly limited. For example, a method for continuously supplying (flowing) the polishing composition by a pump, or the like, is employed. A supply amount thereof is not limited, but it is preferable that the surface of the polishing pad is always covered with the polishing composition, and the supply amount is preferably 10 mL/min or more to 5000 mL/min or less. The polishing time is not particularly limited, but a step using the polishing composition is preferably 5 seconds or more to 180 seconds or less.

(Defect Removing Effect)

In the surface treatment composition according to an embodiment of the present invention, it is preferable that the effect of removing ceria residue (in particular, particle residue derived from ceria) and organic residue on the surface of the object to be surface treated target is high. The number of the particle residues and the organic residues after surface-treating the object to be surface treated with the surface treatment composition (after post-cleaning treatment or drying if the post-cleaning treatment or drying is performed after the surface treatment) is preferably within the following ranges. The upper limit value of the number of particle residues is preferably 100 or less, more preferably 80 or less, further more preferably 70 or less, still more preferably 60 or less, particularly preferably 50 or less, further particularly preferably 40 or less, very preferably 30 or less, and most preferably 20 or less (lower limit of 0). In addition, the upper limit value of the number of organic residues is preferably 80 or less, more preferably 50 or less, furthermore preferably 25 or less, still more preferably 20 or less, particularly preferably 15 or less, further particularly preferably 10 or less, very preferably 5 or less, and most preferably 3 or less (lower limit 0).

<Manufacturing Method of Semiconductor Substrate>

Still another aspect of the present invention relates to a manufacturing method of a semiconductor substrate including treating a surface of a polished object to be polished by the surface treatment method according to an embodiment of the present invention. Here, the manufacturing method of the semiconductor substrate according to an embodiment of the present invention preferably includes polishing an object to be polished (semiconductor substrate before polishing) with a polishing composition including ceria to obtain a polished object to be polished (polished semiconductor substrate), and treating a surface of the polished object to be polished (polished semiconductor substrate) by a surface treatment method according to an embodiment of the present invention.

Although embodiments of the invention have been described in detail, it is to be understood that this is illustrative and exemplary and not restrictive, and it is obvious that the scope of the invention is to be interpreted by the appended claims.

1. A surface treatment composition for surface-treating a polished object to be polished which is obtained after polishing with a polishing composition including ceria, the surface treatment composition including:
a (co)polymer having a monomer-derived structural unit having a carboxyl group or a salt group thereof;
at least one residue removing accelerator selected from the group consisting of a polyvalent hydroxy compound, a derivative of a polyvalent hydroxy compound having one hydroxyl group, and a derivative of a hydroxycarboxylic acid having one or more hydroxyl groups and having no carboxyl group; and
a dispersing medium,
wherein pH is less than 7.

2. The surface treatment composition described in the above 1., wherein the residue removing accelerator is at least one selected from the group consisting of a polyvalent hydroxy compound having 2 or more to 9 or less hydroxyl groups,
a compound having one hydroxyl group as an ether derivative of a polyvalent hydroxy compound having 2 or more to 9 or less hydroxyl groups,
a compound having one hydroxyl group as an ester derivative of a polyvalent hydroxy compound having 2 or more to 9 or less hydroxyl groups and a monovalent carboxylic acid, and
a compound having 1 or more to 4 or less hydroxyl groups and no carboxyl group as an ester derivative of a hydroxycarboxylic acid and a monovalent alcohol.

3. The surface treatment composition described in the above 1. or 2., wherein a molecular weight of the residue removing accelerator is less than 1000.

4. The surface treatment composition described in any one of the above 1. to 3., wherein the (co)polymer is a (co)polymer having a structural unit derived from (meth)acrylic acid or a salt thereof.

5. The surface treatment composition described in anyone of the above 1. to 4., further including silica having an organic acid immobilized on a surface thereof.

6. The surface treatment composition described in anyone of the above 1. to 5., wherein the polished object to be polished contains silicon nitride.

7. The surface treatment composition described in anyone of 1. to 6., wherein a (co)polymer having a monomer-derived structural unit having a carboxyl group or a salt group thereof, a residue removing accelerator, and a dispersing medium are mixed.

8. A surface treatment method including:
surface-treating a polished object to be polished using the surface treatment composition described in any one of 1. to 6.

9. The surface treatment method described in the above 8., further including post-cleaning the polished object to be polished after the surface treatment.

10. A manufacturing method of a semiconductor substrate including:
treating a surface of a polished object to be polished according to the surface treatment method described in the above 8. or 9.

EXAMPLES

The present invention is described in more detail with reference to Examples and Comparative Examples. However, the technical scope of the present invention is not limited to only Examples below.

<Preparation of Compositions for Surface Treatment Nos. 1 to 53>

The (co)polymer and each component shown in Tables 1 and 2 were added to water as a dispersing medium so as to have contents shown in Tables 1 to 3, and mixed by stirring to obtain a surface treatment composition (a mixing temperature about 25° C., a mixing time: about 10 minutes). Here, the pH of the surface treatment composition was adjusted with a pH adjusting agent shown in Tables 1 and 2 and checked by a pH meter (by LAQUA manufactured by HORIBA, Ltd.).

In addition, the description of each component in the Tables is provided below;
The polyacrylic acid salt and the polystyrenesulfonic acid salt were respectively polyacrylic acid ammonium salt and polystyrenesulfonic acid sodium salt;
The phosphinocarboxylic acid copolymer was Belclene (registered trademark) 400 manufactured by BWA;

The copolymer of sodium styrene sulfonate and methacrylic acid (partial structure derived from sodium styrene sulfonate:partial structure derived from methacrylic acid=20:80 (molar ratio)) was shown as sodium styrene sulfonate/methacrylic acid copolymer (20/80) in the Table;

The ethylene glycol-propylene glycol block copolymer was Pronon (registered trademark) #104 manufactured by NOF CORPORATION, the polyoxyethylene glyceryl ether was Uniox (registered trademark) G450 manufactured by NOF CORPORATION, the polyoxyethylene monoisododecyl ether was Nonion ID 203 manufactured by NOF CORPORATION, and the polyoxyethylene monolaurate was Nonion L-2 manufactured by NOF CORPORATION, respectively.

Citric acid and ammonia water were marked as a pH adjusting agent A, iminodiacetic acid and ammonia water were marked as a pH adjusting agent B, maleic acid and ammonia water were marked as a pH adjusting agent C, malonic acid and ammonia water were marked as a pH adjusting agent D, and acetic acid and ammonia water were marked as pH adjusting agent E.

(Molecular Weight)

As the molecular weight of the residue removing accelerator, a value calculated from the sum of atomic weights except for the (co)polymer was used. In addition, measurement conditions of weight average molecular weights (Mw) (polyethylene glycol conversion) of the above-described polyacrylic acid salt, polystyrene sulfonate, phosphinocarboxylic acid copolymer, and the copolymer of sodium styrene sulfonate and methacrylic acid, and the (co)polymer which is the residue removing accelerator are as follows: The results are shown as molecular weights in Tables 1 and 2 below.

GPC apparatus: manufactured by Shimadzu Corporation
Form: Prominence+ELSD detector (ELSD-LTII)
Column: VP-ODS (manufactured by Shimadzu Corporation)
Mobile phase A:MeOH
B:1% acetic acid aqueous solution
Flow rate: 1 mL/min
Detector: ELSD temp. 40° C., Gain 8, $N_2$GAS 350 kPa
Oven temperature: 40° C.
Injection volume: 40 μl.

In addition, the weight average molecular weight (Mw) of polyvinyl alcohol is a value obtained under the following conditions according to a known gel permeation chromatography (GPC) measurement method.

Column: Shodex (registered trademark) OHpak SB-806 HQ+SB-803 HQ (8.0 mmI. D.×300 mm each) (manufactured by Showa Denko K. K.)
Mobile phase: 0.1 M NaCl aqueous solution
Flow rate: 1.0 mL/min
Detector: Shodex (registered trademark) RI (manufactured by Showa Denko K. K.)
Column temperature: 40° C.

TABLE 1

| | | (Co)polymer | | | Residue removing accelerator | | Other components | | pH adjusting agent | Remarks |
|---|---|---|---|---|---|---|---|---|---|---|
| No. | pH | Kind | Molecular weight | Content (g/L) | Kind | Content (g/L) | Kind | Content (g/L) | | |
| 1 | 5 | None | | 0 | None | 0 | None | 0 | A | Comparative Example |
| 2 | 5 | Polyacrylic acid salt | 6000 | 1 | None | 0 | None | 0 | A | Comparative Example |
| 3 | 5 | Polystyrene sulfonate salt | 25000 | 1 | None | 0 | None | 0 | A | Comparative Example |
| 4 | 5 | Polyvinyl alcohol | 10000 | 1 | None | 0 | None | 0 | A | Comparative Example |
| 5 | 5 | None | | 0 | Sorbitol | 3 | None | 0 | A | Comparative Example |
| 6 | 5 | None | | 0 | Trimethylol propane | 3 | None | 0 | A | Comparative Example |
| 7 | 5 | None | | 0 | Polyethylene glycol (Mw = 600) | 1 | None | 0 | A | Comparative Example |
| 8 | 5 | Polyacrylic acid salt | 6000 | 1 | Sorbitol | 3 | None | 0 | A | Example |
| 9 | 5 | Polyacrylic acid salt | 6000 | 1 | Trimethylol propane | 3 | None | 0 | A | Example |
| 10 | 5 | Polyacrylic acid salt | 6000 | 1 | Sorbitol | 0.1 | None | 0 | A | Example |
| 11 | 5 | Polyacrylic acid salt | 6000 | 1 | Sorbitol | 0.5 | None | 0 | A | Example |
| 12 | 5 | Polyacrylic acid salt | 6000 | 1 | Sorbitol | 10 | None | 0 | A | Example |
| 13 | 5 | Polyacrylic acid salt | 6000 | 1 | Polyethylene glycol (Mw = 600) | 1 | None | 0 | A | Example |
| 14 | 5 | Polyacrylic acid salt | 6000 | 1 | Polyoxyethylene monomethyl ether (Mw = 400) | 1 | None | 0 | A | Example |
| 15 | 5 | Polyacrylic acid salt | 6000 | 1 | Polyoxyethylene monobisphenol A (Mw = 660) | 1 | None | 0 | A | Example |
| 16 | 5 | Polyacrylic acid salt | 6000 | 1 | Trimethylol propane | 5 | m-xylene sulfonic acid dihydrate | 2.5 | B | Example |
| 17 | 5 | Polyacrylic acid salt | 6000 | 1 | Sorbitol / Methyl hydroxyisobutyrate | 3 / 5 | m-xylene sulfonic acid dihydrate | 2.5 | B | Example |
| 18 | 5 | Polyacrylic acid salt | 6000 | 1 | Sorbitol | 3 | Isethionic acid | 5 | B | Example |
| 19 | 5 | Polyacrylic acid salt | 6000 | 1 | Trimethylol propane | 3 | Isethionic acid | 5 | B | Example |
| 20 | 5 | Polyacrylic acid salt | 6000 | 1 | Polyethylene glycol (Mw = 600) | 3 | Isethionic acid | 5 | B | Example |

TABLE 1-continued

| No. | pH | (Co)polymer Kind | Molecular weight | Content (g/L) | Residue removing accelerator Kind | Content (g/L) | Other components Kind | Content (g/L) | pH adjusting agent | Remarks |
|---|---|---|---|---|---|---|---|---|---|---|
| 21 | 5 | Polyacrylic acid salt | 6000 | 1 | Dimethyl tartrate | 3 | Isethionic acid | 5 | B | Example |
| 22 | 5 | Polyacrylic acid salt | 2000 | 1 | Glycerin | 3 | None | 0 | C | Example |
| 23 | 5 | Polyacrylic acid salt | 100000 | 1 | Glycerin | 3 | None | 0 | C | Example |
| 24 | 5 | Polyacrylic acid salt | 1000000 | 1 | Glycerin | 3 | None | 0 | C | Example |
| 25 | 2 | Polyacrylic acid salt | 6000 | 1 | Xylitol | 3 | None | 0 | C | Example |
| 26 | 6 | Polyacrylic acid salt | 6000 | 1 | Xylitol | 3 | None | 0 | C | Example |
| 27 | 10 | Polyacrylic acid salt | 6000 | 1 | Xylitol | 3 | None | 0 | C | Comparative Example |
| 28 | 5 | Polyacrylic acid salt | 6000 | 0.001 | Pentaerythritol | 3 | None | 0 | C | Example |
| 29 | 5 | Polyacrylic acid salt | 6000 | 0.1 | Pentaerythritol | 3 | None | 0 | C | Example |
| 30 | 5 | Polyacrylic acid salt | 6000 | 5 | Pentaerythritol | 3 | None | 0 | C | Example |
| 31 | 5 | Phosphinocarboxylic acid copolymer | 500 | 1 | Di(trimethylol propane) | 3 | None | 0 | D | Example |
| 32 | 5 | Sodium styrene sulfonate/methacrylic acid copolymer (20/80) | 13000 | 1 | Di(trimethylol propane) | 3 | None | 0 | D | Example |
| 33 | 5 | Polyacrylic acid salt | 6000 | 1 | Methyl hydroxyisobutyrate | 5 | None | 0 | D | Example |
| 34 | 5 | Polyacrylic acid salt | 6000 | 1 | Ethyl glycolate | 5 | None | 0 | D | Example |
| 35 | 5 | Polyacrylic acid salt | 6000 | 1 | Methyl glycerate | 5 | None | 0 | D | Example |
| 36 | 5 | Polyacrylic acid salt | 6000 | 1 | Triethyl citrate | 5 | None | 0 | D | Example |
| 37 | 5 | Polyacrylic acid salt | 6000 | 1 | Trimethylol ethane | 3 | None | 0 | D | Example |
| 38 | 5 | Polyacrylic acid salt | 6000 | 1 | Polypropylene glycol (Mw = 400) | 1 | None | 0 | D | Example |
| 39 | 5 | Polyacrylic acid salt | 6000 | 1 | Ethylene glycol-propylene glycol block copolymer (Mw = 1670) | 1 | None | 0 | D | Example |
| 40 | 5 | Polyacrylic acid salt | 6000 | 1 | Polyoxyethylene glyceryl ether (Mw = 450) | 1 | None | 0 | D | Example |
| 41 | 5 | Polyacrylic acid salt | 6000 | 1 | Polyoxyethylene monoisododecyl ether (Mw = 250) | 1 | None | 0 | D | Example |
| 42 | 5 | Polyacrylic acid salt | 6000 | 1 | Polyoxyethylene monolaurate (Mw = 270) | 1 | None | 0 | D | Example |
| 43 | 5 | Polyacrylic acid salt | 6000 | 1 | Triethylol propane | 5 | Sodium di-(2-ethylhexyl)sulfo-succinate | 0.1 | C | Example |
| 44 | 5 | Polyacrylic acid salt | 6000 | 1 | Sorbitol / Triethyl citrate | 3 / 5 | Sodium di-(2-ethylhexyl)sulfo-succinate | 0.1 | C | Example |
| 45 | 5 | Polyacrylic acid salt | 6000 | 1 | Glycerin | 3 | None | 0 | C | Example |
| 46 | 5 | Polyacrylic acid salt | 6000 | 1 | Pentaerythritol | 3 | None | 0 | C | Example |
| 47 | 5 | Polyacrylic acid salt | 6000 | 1 | Dimethyl tartrate | 3 | None | 0 | B | Example |
| 48 | 5 | Polyacrylic acid salt | 6000 | 1 | Di(trimethylol propane) | 3 | None | 0 | D | Example |
| 49 | 5 | Polyacrylic acid salt | 6000 | 1 | Xylitol | 3 | None | 0 | C | Example |

TABLE 2

| No. | pH | (Co)polymer Kind | Molecular weight | Content (g/L) | Residue removing accelerator Kind | Content (g/L) | Other components Kind | Content (g/L) | pH adjusting agent | Remarks |
|---|---|---|---|---|---|---|---|---|---|---|
| 50 | 5 | None | | 0 | None | 0 | None | 0 | E | Comparative Example |
| 51 | 5 | Polyacrylic acid salt | 6000 | 1 | Xylitol | 3 | None | 0 | E | Example |
| 52 | 5 | None | | 0 | None | 0 | Abrasive grain S | 2.5 | E | Comparative Example |
| 53 | 5 | Polyacrylic acid salt | 6000 | 1 | Xylitol | 3 | Abrasive grain S | 2.5 | E | Example |

(Note 1)
Abrasive grain S: colloidal silica (average primary particle size: 32 nm, average secondary particle size: 70 nm) having a sulfonic acid immobilized on a surface thereof <Preparation of Polished Object to be Polished (Object to be Surface Treated)>

The polished objects to be polished (polished silicon nitride substrates) after being polished by the chemical mechanical polishing (CMP) step to be described below were prepared as objects to be subjected to surface treatment, respectively.

[CMP Step]

With respect to a silicon nitride substrate, which is a semiconductor substrate, each polishing composition C including ceria (a polishing composition containing 1.0 mass % of MIREK E05 (Mitsui Mining & Smelting Co., Ltd.), 0.1 mass % of sodium polyacrylate (weight average molecular weight of 10000) in water as a dispersing medium and having pH=4 adjusted with acetic acid) was used, and polishing was performed under the following conditions, respectively. Here, a 200 mm wafer was used for the silicon nitride substrate.

(Polishing Apparatus and Polishing Conditions)

Cleaning apparatus integrated type polishing apparatus: MirraMesa manufactured by Applied Materials, Inc.

Polishing pad: Rigid polyurethane pad IC1010 manufactured by Nitta Haas Incorporated.

Polishing pressure: 2.0 psi (1 psi=6894.76 Pa, hereinafter the same is applied)

Rotation speed of polishing table: 60 rpm

Rotation speed of head: 60 rpm

Supply of polishing composition: flow

Supply amount of polishing composition: 100 mL/min

Polishing time: 60 seconds

Object to be polished: 200 mm wafer (silicon nitride substrate: manufactured by low pressure chemical vapor deposition (LPCVD), thickness of 2500 Å)

<Surface Treatment Method>

The polished object to be polished after polishing by the CMP step was subjected to rinse polishing under the following conditions.

[Surface Treatment Step]

(Rinse Polishing Treatment 1: Rinse Polishing Apparatus and Rinse Polishing Condition)

Cleaning apparatus integrated type polishing apparatus: MirraMesa manufactured by Applied Materials, Inc.

Polishing pad: Rigid polyurethane pad IC1010 manufactured by Nitta Haas Incorporated.

Polishing pressure: 1.0 psi

Rotation speed of polishing table: 60 rpm

Rotation speed of head: 60 rpm

Kind of rinse polishing composition: water (deionized water)

Supply of rinse polishing composition: flow

Supply amount of polishing composition: 100 mL/min

Rinse polishing time: 30 seconds (Rinse Polishing Treatment 2: Rinse Polishing Apparatus and Rinse Polishing Condition)

Using the polishing table different from that of the rinse polishing treatment 1, rinse polishing treatment 2 was performed under the following conditions continuously from the rinse polishing treatment 1.

Cleaning apparatus integrated type polishing apparatus: MirraMesa manufactured by Applied Materials, Inc.

Polishing pad: Rigid polyurethane pad IC1010 manufactured by Nitta Haas Incorporated.

Polishing pressure: 1.0 psi

Rotation speed of the polishing table: 60 rpm

Rotation speed of head: 60 rpm

Kind of composition for rinse polishing: Compositions for surface treatment Nos. 1 to 53

Supply of rinse polishing composition: flow

Supply amount of rinse polishing composition: 100 mL/min

Rinse polishing time: 60 seconds

[Post-Cleaning Treatment Step]

(Post-Cleaning Treatment: Post-Cleaning Apparatus and Post-Cleaning Condition)

The polished object to be polished after the rinse polishing treatment 2 was preferably pulled up and taken out while applying the surface treatment composition. Subsequently, using the water (deionized water), each polished object to be polished was cleaned by the cleaning method of rubbing each polished object to be polished under the following conditions while applying a pressure with a sponge made of polyvinyl alcohol (PVA), which is a cleaning brush.

Cleaning apparatus integrated type polishing apparatus: MirraMesa manufactured by Applied Materials, Inc.

Rotation speed of cleaning brush: 100 rpm

Rotation speed of polished object to be polished: 50 rpm

Kind of composition for post-cleaning treatment: water (deionized water)

Supply amount of composition for post-cleaning treatment: 1000 mL/min

Cleaning time: 60 seconds

<Evaluation>

The following items were measured and evaluated for each polished object to be polished after the post-cleaning treatment described above

[Evaluation of Total Number of Defects]

The number of defects of 0.13 µm or more was measured for the polished object to be polished after the above-described post-cleaning treatment. SP-2 manufactured by KLA TENCOR was used for the measurement of the number of defects. The measurement was performed on the remaining portion excluding a portion of 5 mm in width from an outer peripheral end portion of a single side of the polished object to be polished (a portion ranging from 0 mm to 5 mm in width when the outer peripheral edge was set to 0 mm).

[Evaluation of the Number of Particle Residues]

With respect to the polished object to be polished after the above-described post-cleaning treatment, the number of particle residues was measured by SEM observation using Review SEM RS6000 manufactured by Hitachi, Ltd. First, by the SEM observation, 100 defects existing in the remaining portion excluding the portion of 5 mm in width from the outer peripheral end portion of the single side of the polished object to be polished (a portion ranging from 0 mm to 5 mm in width when the outer peripheral end portion was set to 0 mm) were sampled. Then, from the sampled 100 defects, the particle residues were visually observed by SEM observation and the number of the particle residues was checked, thereby calculating the percentage (%) of the particle residues in the defects. Then, the multiplication of the number of defects (number) of 0.13 µm or more measured by using SP-2 manufactured by KLA TENCOR Co., Ltd., in the evaluation of the number of defects and the ratio (%) of particle residue in the defects calculated from the SEM observation result, was calculated as the number of particle residues (number).

Further, the particle residue was subjected to elemental analysis with an energy dispersive X-ray analyzer (EDX), and as a result, it was confirmed that the particle residue was derived from ceria.

[Evaluation of the Number of Organic Residues]

With respect to the polished object to be polished after the above-described post-cleaning treatment, the number of organic residues was measured by SEM observation using Review SEM RS6000 manufactured by Hitachi, Ltd. First, by the SEM observation, 100 defects existing in the remaining portion excluding the portion of 5 mm in width from the outer peripheral end portion of the single side of the polished object to be polished (a portion ranging from 0 mm to 5 mm in width when the outer peripheral end portion was set to 0 mm) were sampled. Then, from the sampled 100 defects, the organic residue was visually observed by SEM observation and the number of the particle residues was checked, thereby calculating the percentage (%) of the organic residue in the defects. Then, the multiplication of the number of defects (number) of 0.13 μm or more measured by using SP-2 manufactured by KLA TENCOR Co., Ltd., in the evaluation of the number of defects and the ratio (%) of organic residue in the defects calculated from the SEM observation result, was calculated as the number of organic residues (number).

[Evaluation of the Number of Other Residues]

By subtracting the value of the number of particle residues and the value of the number of organic residues from the value of the total number of defects, the number of other residues (number) was calculated.

For each surface treatment composition, the evaluation results in the case of using the polished silicon nitride substrate as the object to be surface treated are shown in Tables 3 and 4, respectively.

TABLE 3

(Evaluation result of each surface treatment composition on polished silicon nitride substrate)

| No. | The number of particle residues (number) | The number of organic residues (number) | The number of other residues (number) | Total number of defects (number) | Remarks |
|---|---|---|---|---|---|
| 1 | 305 | 191 | 42 | 538 | Comparative Example |
| 2 | 133 | 6 | 2 | 141 | Comparative Example |
| 3 | 5244 | 7 | 0 | 5251 | Comparative Example |
| 4 | 542 | 42 | 3 | 587 | Comparative Example |
| 5 | 60 | 116 | 35 | 210 | Comparative Example |
| 6 | 81 | 98 | 37 | 217 | Comparative Example |
| 7 | 193 | 95 | 6 | 295 | Comparative Example |
| 8 | 37 | 2 | 1 | 40 | Example |
| 9 | 29 | 4 | 2 | 34 | Example |
| 10 | 37 | 2 | 1 | 40 | Example |
| 11 | 37 | 0 | 1 | 38 | Example |
| 12 | 45 | 3 | 1 | 49 | Example |
| 13 | 36 | 2 | 1 | 39 | Example |
| 14 | 38 | 1 | 1 | 40 | Example |
| 15 | 64 | 3 | 1 | 68 | Example |
| 16 | 15 | 1 | 0 | 16 | Example |
| 17 | 18 | 2 | 0 | 20 | Example |
| 18 | 22 | 0 | 1 | 23 | Example |
| 19 | 25 | 2 | 1 | 27 | Example |
| 20 | 32 | 7 | 1 | 40 | Example |
| 21 | 28 | 6 | 2 | 36 | Example |
| 22 | 24 | 2 | 0 | 26 | Example |
| 23 | 25 | 3 | 1 | 29 | Example |
| 24 | 18 | 4 | 0 | 22 | Example |
| 25 | 72 | 7 | 3 | 82 | Example |
| 26 | 42 | 12 | 2 | 56 | Example |
| 27 | 3891 | 1998 | 339 | 6228 | Comparative Example |
| 28 | 96 | 77 | 29 | 202 | Example |
| 29 | 64 | 5 | 2 | 71 | Example |
| 30 | 49 | 2 | 1 | 52 | Example |
| 31 | 58 | 3 | 1 | 62 | Example |
| 32 | 33 | 19 | 19 | 71 | Example |
| 33 | 42 | 9 | 1 | 52 | Example |
| 34 | 42 | 5 | 2 | 49 | Example |
| 35 | 39 | 2 | 1 | 42 | Example |
| 36 | 31 | 4 | 3 | 38 | Example |
| 37 | 28 | 3 | 2 | 33 | Example |
| 38 | 36 | 2 | 1 | 39 | Example |
| 39 | 59 | 4 | 2 | 65 | Example |
| 40 | 55 | 3 | 2 | 60 | Example |
| 41 | 44 | 2 | 1 | 47 | Example |
| 42 | 36 | 7 | 3 | 46 | Example |
| 43 | 16 | 3 | 1 | 20 | Example |
| 44 | 19 | 2 | 1 | 22 | Example |
| 45 | 26 | 1 | 0 | 27 | Example |
| 46 | 39 | 2 | 0 | 41 | Example |

TABLE 3-continued (Evaluation result of each surface treatment composition on polished silicon nitride substrate)

| No. | The number of particle residues (number) | The number of organic residues (number) | The number of other residues (number) | Total number of defects (number) | Remarks |
|---|---|---|---|---|---|
| 47 | 27 | 5 | 1 | 33 | Example |
| 48 | 32 | 4 | 0 | 36 | Example |
| 49 | 28 | 3 | 1 | 32 | Example |

TABLE 4

(Evaluation result of each surface treatment composition on polished silicon nitride substrate)

| No. | The number of particle residues (number) | The number of organic residues (number) | The number of other residues (number) | Total number of defects (number) | Remarks |
|---|---|---|---|---|---|
| 50 | 305 | 191 | 42 | 538 | Comparative Example |
| 51 | 28 | 4 | 0 | 32 | Example |
| 52 | 398 | 97 | 8 | 503 | Comparative Example |
| 53 | 43 | 9 | 1 | 53 | Example |

As shown in Table 3 and Table 4, when the polished silicon nitride substrate was used as the object to be surface treated, it was confirmed that the compositions for surface treatment Nos. 8 to 26, 28 to 49, 51 and 53 according to an embodiment of the present invention showed the effect of reducing the total number of defects after the objected to be polished which has been polished, obtained after polishing with the polishing composition including ceria was subjected to surface treatment as compared with the compositions for surface treatment Nos. 1 to 7, 27, 50 and 52 which were outside the scope of the present invention.

As described above, it was confirmed that the surface treatment composition according to an embodiment of the present invention satisfactorily lowered the ceria residue and suppressed the total number of defects including the residue other than the ceria residue at an extremely high level in the polished object to be polished which is obtained after polishing with the polishing composition including ceria.

The present application is based on the Japanese patent application No. 2017-185299 filed on Sep. 26, 2017, and a disclosed content thereof is incorporated herein as a whole by reference.

What is claimed is:

1. A surface treatment composition for surface-treating a polished object to be polished which is obtained after polishing with a polishing composition including ceria, the surface treatment composition comprising:
    a (co)polymer having a monomer-derived structural unit having a carboxyl group or a salt group thereof;
    at least one residue removing accelerator selected from the group consisting of a polyvalent hydroxy compound, and an ester derivative of a hydroxycarboxylic acid and a monovalent alcohol having one or more hydroxyl groups and having no carboxyl group,
    wherein the polyvalent hydroxy compound is at least one selected from the group consisting of polyoxyethylene mono- or di-bisphenol A, polyoxypropylene mono- or di-bisphenol A, polyoxyethylene glyceryl ether, polyoxypropylene glyceryl ether, a sugar alcohol, a trihydric or higher polyvalent alcohol other than a polyoxyalkylene compound and a sugar alcohol, a compound having two or more hydroxyl groups directly bonded to a benzene ring or a condensed ring thereof, and a derivative of a compound having two or more hydroxyl groups directly bonded to a benzene ring or a condensed ring thereof,
    wherein the trihydric or higher polyvalent alcohol other than a polyoxyalkylene compound and a sugar alcohol is at least one selected from the group consisting of alkanol, and a (poly)ether compound having a structure formed by condensation of a polyvalent alcohol other than an alkylene glycol; and
    a dispersing medium,
    wherein pH is less than 7.

2. The surface treatment composition according to claim 1, wherein the residue removing accelerator is at least one selected from the group consisting of
    the polyvalent hydroxy compound, that is a polyvalent hydroxy compound having 2 or more to 9 or less hydroxyl groups,
    and
    the ester derivative of a hydroxycarboxylic acid and a monovalent alcohol having one or more hydroxyl groups and having no carboxyl group, that is a compound having 1 or more to 4 or less hydroxyl groups and no carboxyl group as an ester derivative of a hydroxycarboxylic acid and a monovalent alcohol.

3. The surface treatment composition according to claim 1, wherein a molecular weight of the residue removing accelerator is less than 1000.

4. The surface treatment composition according to claim 1, wherein the (co)polymer is a (co)polymer having a structural unit derived from (meth)acrylic acid or a salt thereof.

5. The surface treatment composition according to claim 1, further comprising silica having an organic acid immobilized on a surface thereof.

6. A manufacturing method of the surface treatment composition having a pH of less than 7, for surface-treating a polished object to be polished which is obtained after polishing with a polishing composition including ceria, comprising
mixing at least a (co)polymer having a monomer-derived structural unit having a carboxyl group or a salt group thereof, a residue removing accelerator, and a dispersing medium, wherein:
the residue removing accelerator is at least one selected from the group consisting of a polyvalent hydroxy compound, and an ester derivative of a hydroxycarboxylic acid and a monovalent alcohol having one or more hydroxyl groups and having no carboxyl group;
the polyvalent hydroxy compound is at least one selected from the group consisting of polyoxyethylene mono- or di-bisphenol A, polyoxypropylene mono- or di-bisphenol A, polyoxyethylene glyceryl ether, polyoxypropylene glyceryl ether, a sugar alcohol, a trihydric or higher polyvalent alcohol other than a polyoxyalkylene compound and a sugar alcohol, a compound having two or more hydroxyl groups directly bonded to a benzene ring or a condensed ring thereof, and a derivative of a compound having two or more hydroxyl groups directly bonded to a benzene ring or a condensed ring thereof; and
the trihydric or higher polyvalent alcohol other than a polyoxyalkylene compound and a sugar alcohol is at least one selected from the group consisting of alkanol, and a (poly)ether compound having a structure formed by condensation of a polyvalent alcohol other than an alkylene glycol.

7. A surface treatment method comprising:
polishing an object to be polished using a polishing composition including ceria to obtain a polished object to be polished; and
surface-treating the polished object to be polished using a surface treatment composition to reduce a defect comprising ceria residue on the polished object to be polished;
wherein the surface treatment composition comprises:
  a (co)polymer having a monomer-derived structural unit having a carboxyl group or a salt group thereof;
  at least one residue removing accelerator selected from the group consisting of a polyvalent hydroxy compound, a derivative of a polyvalent hydroxy compound having one hydroxyl group, and a derivative of a hydroxycarboxylic acid having one or more hydroxyl groups and having no carboxyl group; and
  a dispersing medium,
    wherein the pH of the surface treatment composition is less than 7.

8. The surface treatment method according to claim 7, further comprising: post-cleaning the polished object to be polished after the surface treatment.

9. A manufacturing method of a semiconductor substrate comprising:
treating a surface of a polished object to be polished by the surface treatment method according to claim 7.

10. The surface treatment method according to claim 7, wherein the polished object to be polished contains silicon nitride.

11. The surface treatment composition according to claim 1, wherein the residue removing accelerator is the polyvalent hydroxy compound.

12. The surface treatment composition according to claim 1, wherein the residue removing accelerator is at least one selected from the group consisting of polyoxyethylene monobisphenol A, polyoxyethylene glyceryl ether, glycerin, sorbitol, xylitol, pentaerythritol, trimethylol ethane, trimethylol propane, triethylol propane, di(trimethylol propane), methyl hydroxyisobutyrate, dimethyl tartrate, ethyl glycolate, methyl glycerate, triethyl citrate.

13. The surface treatment composition according to claim 1, wherein the (co)polymer having a monomer-derived structural unit having a carboxyl group or a salt group thereof is a copolymer having a monomer-derived structural unit having a carboxyl group or a salt group thereof and a structural unit derived from other monomers.

14. The surface treatment composition according to claim 1, wherein the (co)polymer having a monomer-derived structural unit having a carboxyl group or a salt group thereof is at least one selected from the group consisting of:
poly(meth)acrylic acid or a salt thereof;
a copolymer of (meth) acrylic acid and styrene sulfonic acid or a salt thereof; and
a copolymer composed of a reaction product of hypophosphorous acid or a salt thereof, (meth)acrylic acid and 2-(meth)acrylamide-2-methylpropanesulfonic acid, or a salt thereof.

15. The surface treatment composition according to claim 1, further comprising at least one selected from the group consisting of a compound represented by the following Chemical Formula (1) or a salt thereof, and a compound represented by the following Chemical Formula (2) or a salt thereof:

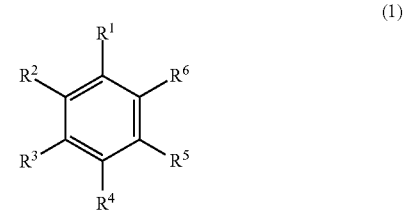

(1)

wherein in Chemical Formula (1) above, $R^1$ to $R^6$ are each independently a hydrogen atom, a hydroxyl group, a sulfo group, an anionic group not containing a sulfo group, a cationic group, an alkoxycarbonyl group having 2 to 12 carbon atoms, or a hydrocarbon group having 1 to 10 carbon atoms, wherein at least one of $R^1$ to $R^6$ is a sulfo group;

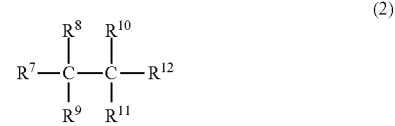

(2)

wherein in Chemical Formula (2) above, $R^7$ to $R^{12}$ are each independently a hydrogen atom, a hydroxyl group, a sulfo group, an anionic group not containing a sulfo group, a cationic group, an alkoxycarbonyl group having 2 to 12 carbon atoms, or a hydrocarbon group having 1 to 10 carbon atoms, wherein at least one of $R^7$ to $R^{12}$ is a sulfo group.

16. The surface treatment composition according to claim 1, further comprising at least one selected from the group consisting of isethionic acid or a salt thereof, m-xylene sulfonic acid or a salt thereof, di(2-ethylhexyl) sulfosuccinic acid or a salt thereof.

17. The surface treatment composition according to claim 1, consisting of:
the (co)polymer having a monomer-derived structural unit having a carboxyl group or a salt group thereof;
the residue removing accelerator;
the dispersing medium; and
a pH adjusting agent.

18. The surface treatment method according to claim 7, wherein:
the residue removing accelerator is at least one selected from the group consisting of a polyvalent hydroxy compound, and an ester derivative of a hydroxycarboxylic acid and a monovalent alcohol having one or more hydroxyl groups and having no carboxyl group;
the polyvalent hydroxy compound is at least one selected from the group consisting of polyoxyethylene mono- or di-bisphenol A, polyoxypropylene mono- or di-bisphenol A, polyoxyethylene glyceryl ether, polyoxypropylene glyceryl ether, a sugar alcohol, a trihydric or higher polyvalent alcohol other than a polyoxyalkylene compound and a sugar alcohol, a compound having two or more hydroxyl groups directly bonded to a benzene ring or a condensed ring thereof, and a derivative of a compound having two or more hydroxyl groups directly bonded to a benzene ring or a condensed ring thereof; and
the trihydric or higher polyvalent alcohol other than a polyoxyalkylene compound and a sugar alcohol is at least one selected from the group consisting of alkanol, and a (poly)ether compound having a structure formed by condensation of a polyvalent alcohol other than an alkylene glycol.

19. The surface treatment method according to claim 7, wherein the (co)polymer having a monomer-derived structural unit having a carboxyl group or a salt group thereof is a copolymer having a monomer-derived structural unit having a carboxyl group or a salt group thereof and a structural unit derived from other monomers.

20. The surface treatment method according to claim 7, wherein the surface treatment composition consists of:
the (co)polymer having a monomer-derived structural unit having a carboxyl group or a salt group thereof;
the residue removing accelerator;
the dispersing medium; and
a pH adjusting agent.

* * * * *